(12) United States Patent
Muraoka et al.

(10) Patent No.: US 8,646,171 B2
(45) Date of Patent: Feb. 11, 2014

(54) COMPONENT MOUNTING APPARATUS AND METHOD

(75) Inventors: Nobuhiko Muraoka, Saga (JP); Syozo Kadota, Osaka (JP)

(73) Assignee: Panasonic Corporation, Osaka (JP)

( * ) Notice: Subject to any disclaimer, the term of this patent is extended or adjusted under 35 U.S.C. 154(b) by 703 days.

(21) Appl. No.: 12/935,640

(22) PCT Filed: Mar. 30, 2009

(86) PCT No.: PCT/JP2009/001452
§ 371 (c)(1),
(2), (4) Date: Sep. 30, 2010

(87) PCT Pub. No.: WO2009/122711
PCT Pub. Date: Oct. 8, 2009

(65) Prior Publication Data
US 2011/0023296 A1 Feb. 3, 2011

(30) Foreign Application Priority Data

Apr. 1, 2008 (JP) .................................. 2008-094796
Apr. 1, 2008 (JP) .................................. 2008-094807

(51) Int. Cl.
*H05K 13/04* (2006.01)
(52) U.S. Cl.
USPC ................ 29/739; 29/743; 29/759; 29/832; 29/843
(58) Field of Classification Search
CPC ............... H01L 24/86; H01L 2924/01004; H01L 2924/01033; H01L 2924/01051; H01L 2924/01082; H05K 3/323; H05K 3/361
USPC .......... 29/832, 842, 843, 739, 740, 741, 742, 29/743, 759
See application file for complete search history.

(56) References Cited

U.S. PATENT DOCUMENTS

| 6,034,524 A * | 3/2000 | Barringer et al. ........ 324/750.22 |
| 2003/0033034 A1 | 2/2003 | Tsuji et al. |
| 2011/0016707 A1* | 1/2011 | Song et al. ..................... 29/830 |

FOREIGN PATENT DOCUMENTS

| JP | 2-9599 | 3/1990 |
| JP | 11-067839 | 3/1999 |

(Continued)

OTHER PUBLICATIONS

International Search Report issued Apr. 21, 2009 in International (PCT) Application No. PCT/JP2009/001452.

(Continued)

*Primary Examiner* — Livius R Cazan
(74) *Attorney, Agent, or Firm* — Wenderoth, Lind & Ponack, L.L.P.

(57) ABSTRACT

A component mounting apparatus includes: a conveyor device for sucking and holding a substrate in a substantially vertical posture and conveying the substrate in a direction extending along its flat plate surface; a plurality of working devices for performing a working process for mounting areas in edge portions of the substantially vertical-postured substrate received from the conveyor device. In the component mounting apparatus, each of the working devices includes: a substrate holder for sucking and holding the substrate in a substantially vertical posture; a holder up/down device for moving the sucked and held substrate to a downward working position; a receiving member for supporting an edge portion of the substrate positioned in the working position from its back face side; and a working unit for performing the working process on the mounting areas of the edge portions of the substrate positioned in the working position from its front face side.

10 Claims, 21 Drawing Sheets

(56) References Cited

FOREIGN PATENT DOCUMENTS

| JP | 11-204579 | 7/1999 |
|----|-----------|--------|
| JP | 2003-076290 | 3/2003 |
| JP | 2004-123254 | 4/2004 |
| JP | 3781604 | 5/2006 |
| WO | 01/62062 | 8/2001 |

OTHER PUBLICATIONS

English translation of International Preliminary Report on Patentability and Written Opinion of the International Searching Authority, Nov. 30, 2010, issued in PCT/JP2009/001452.

Partial English translation of JP 2-9599, Mar. 1990.

* cited by examiner

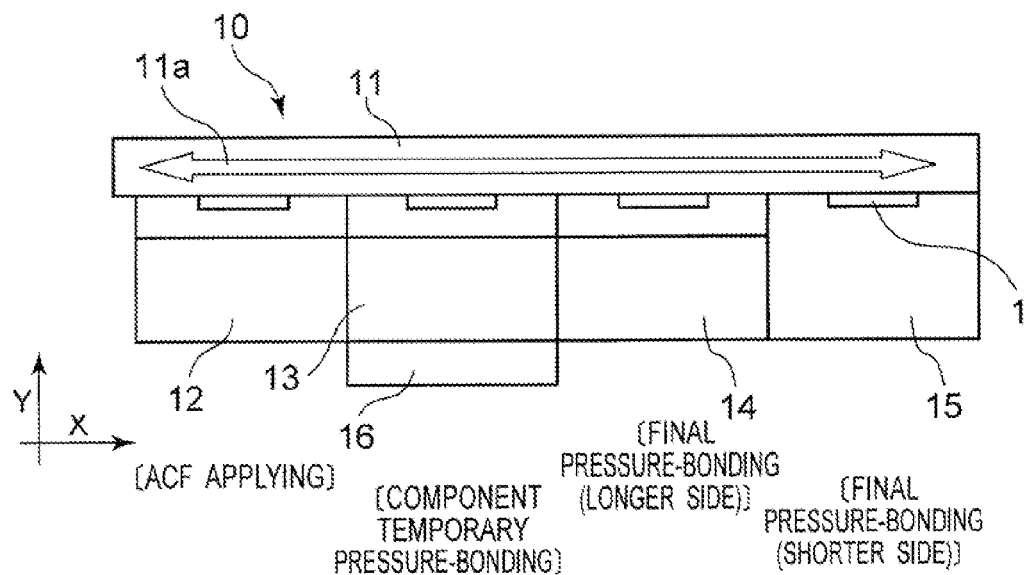
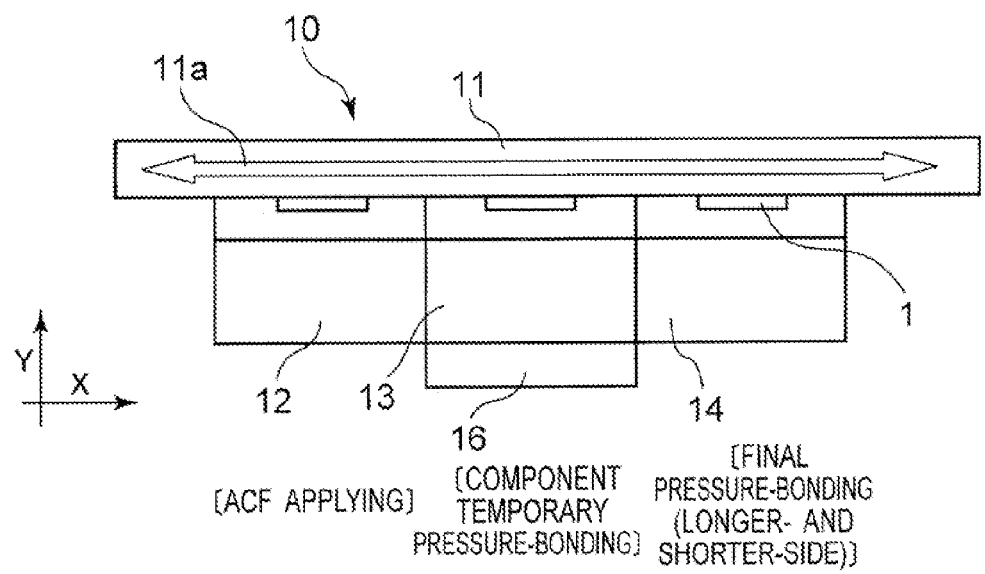

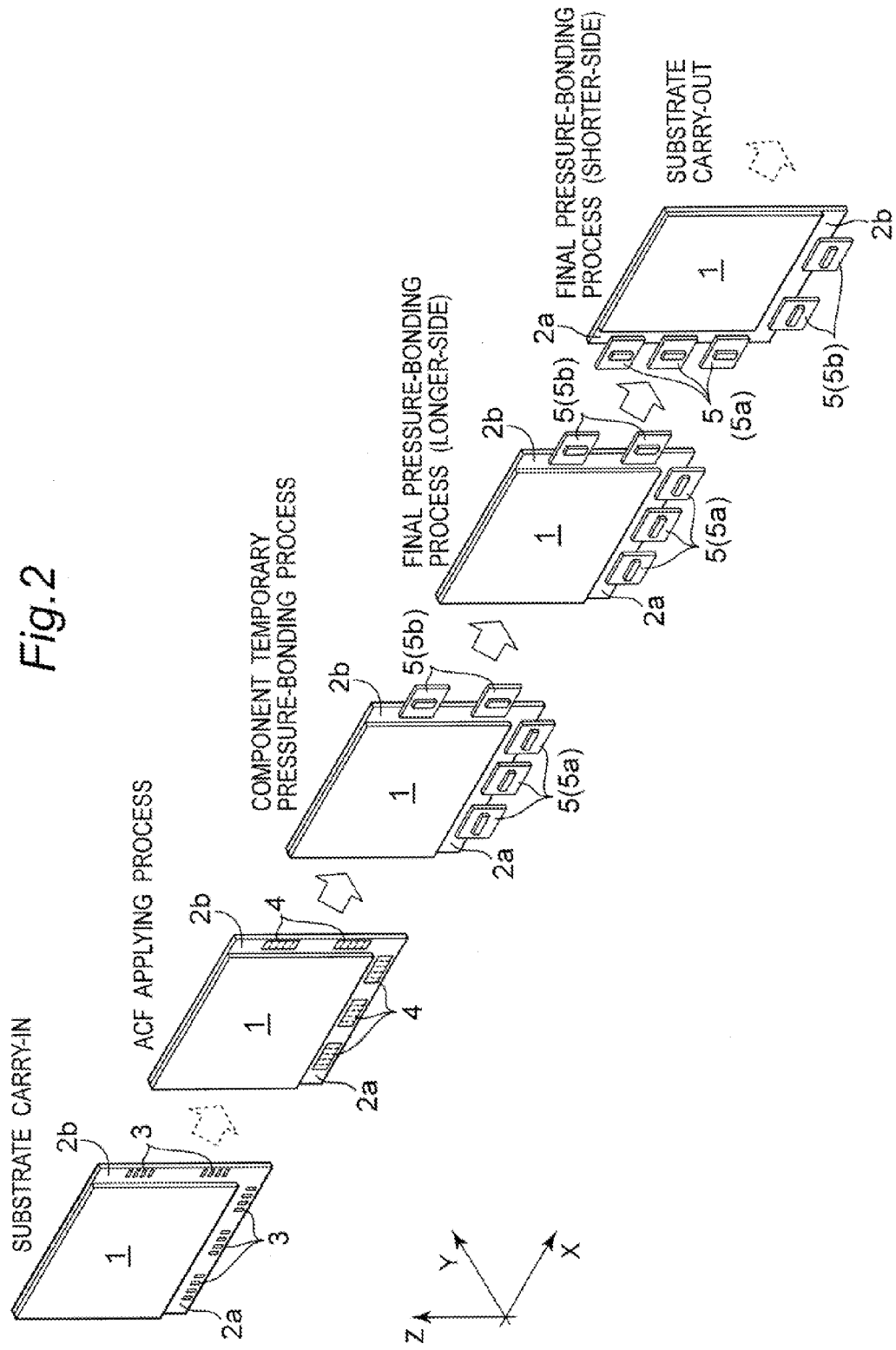

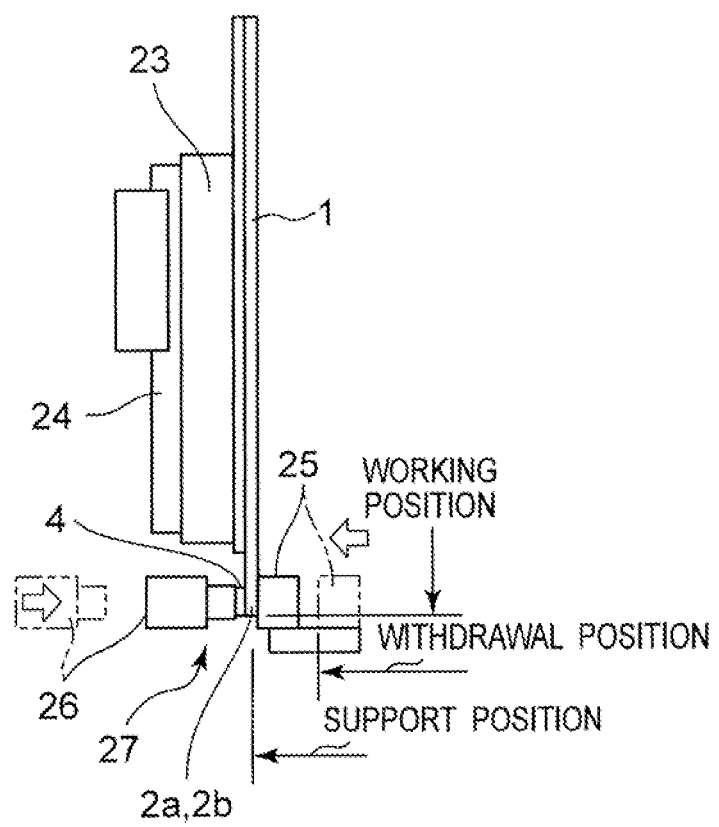

Fig. 12A
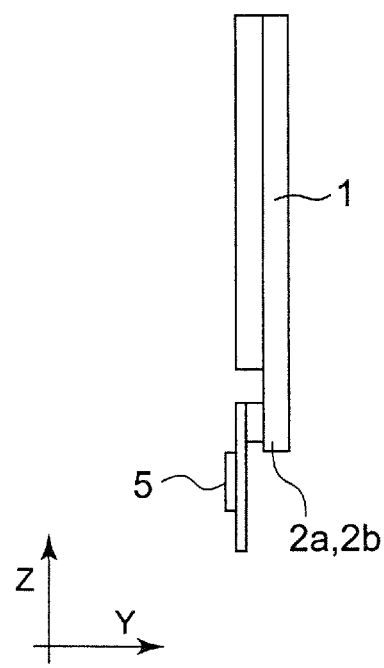
Fig. 12B - PRIOR ART
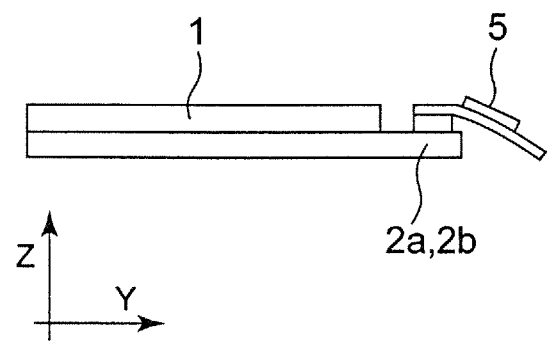

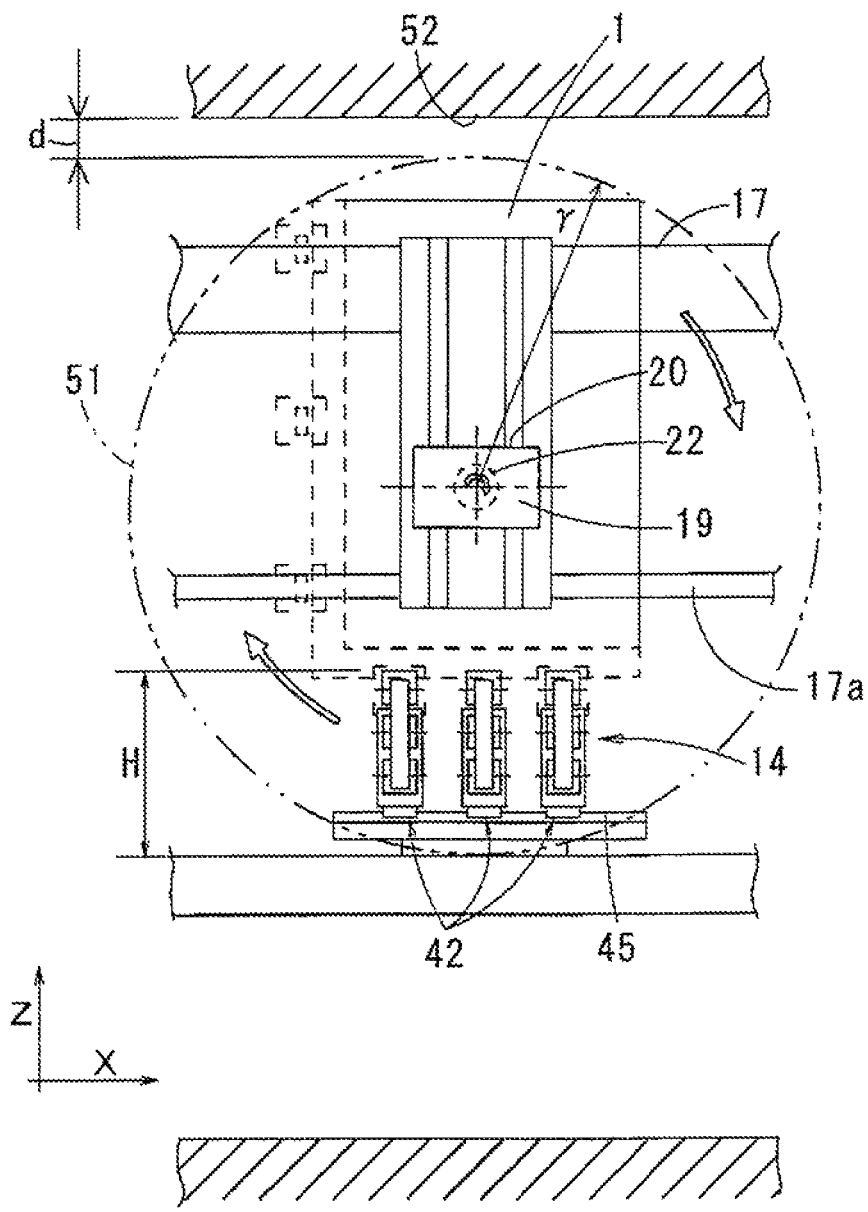

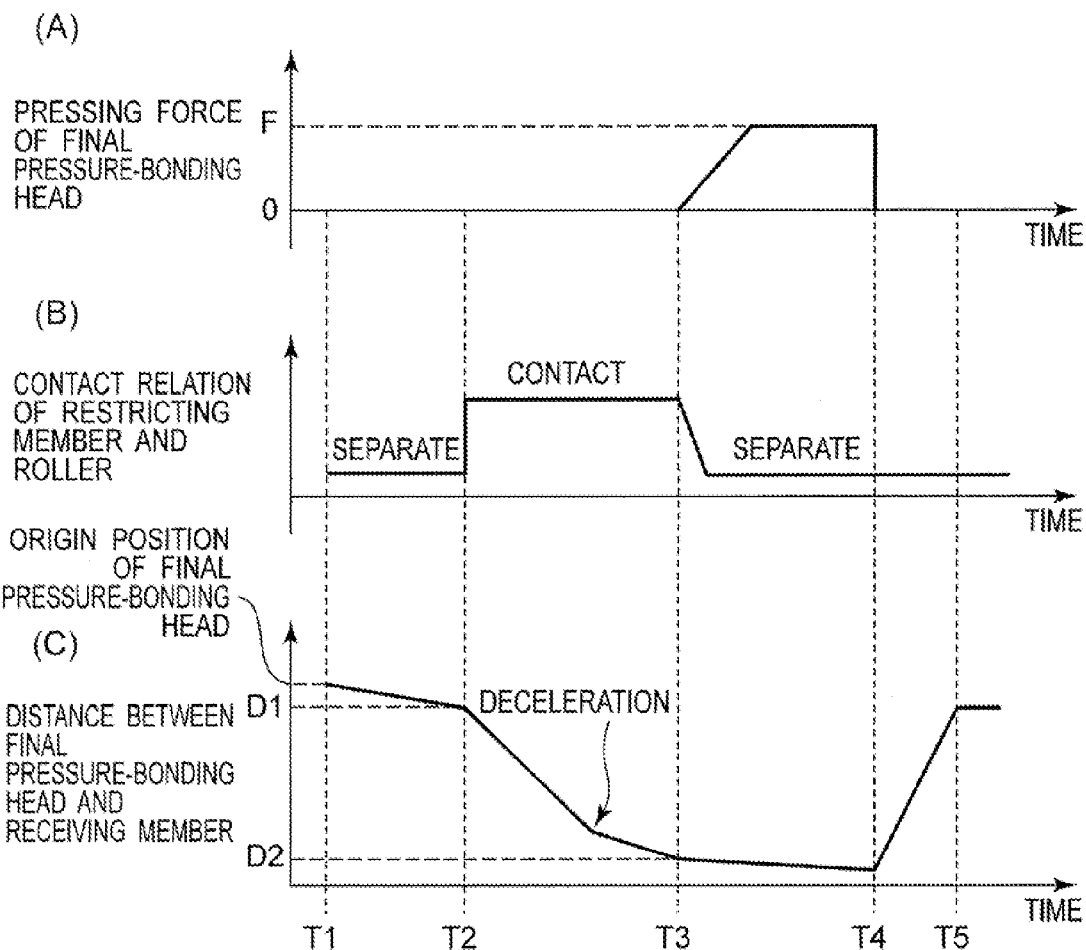

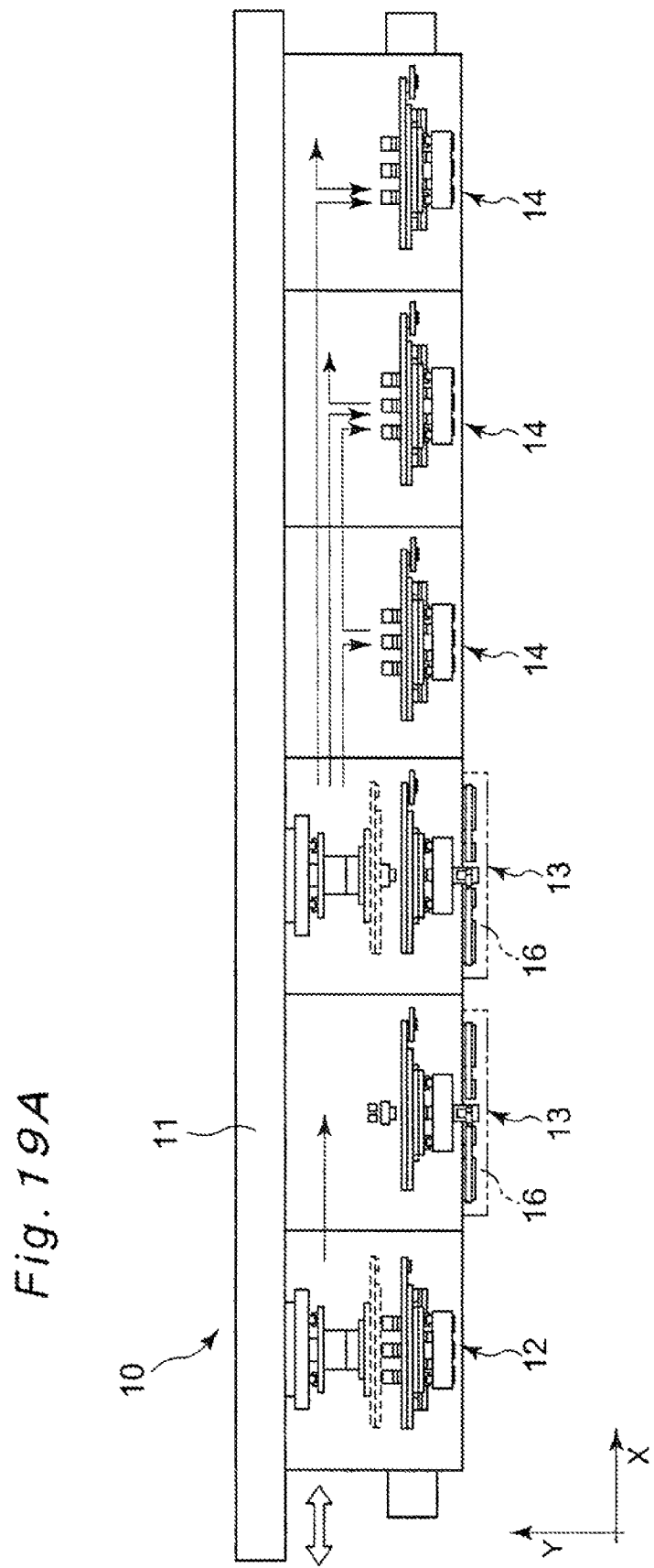

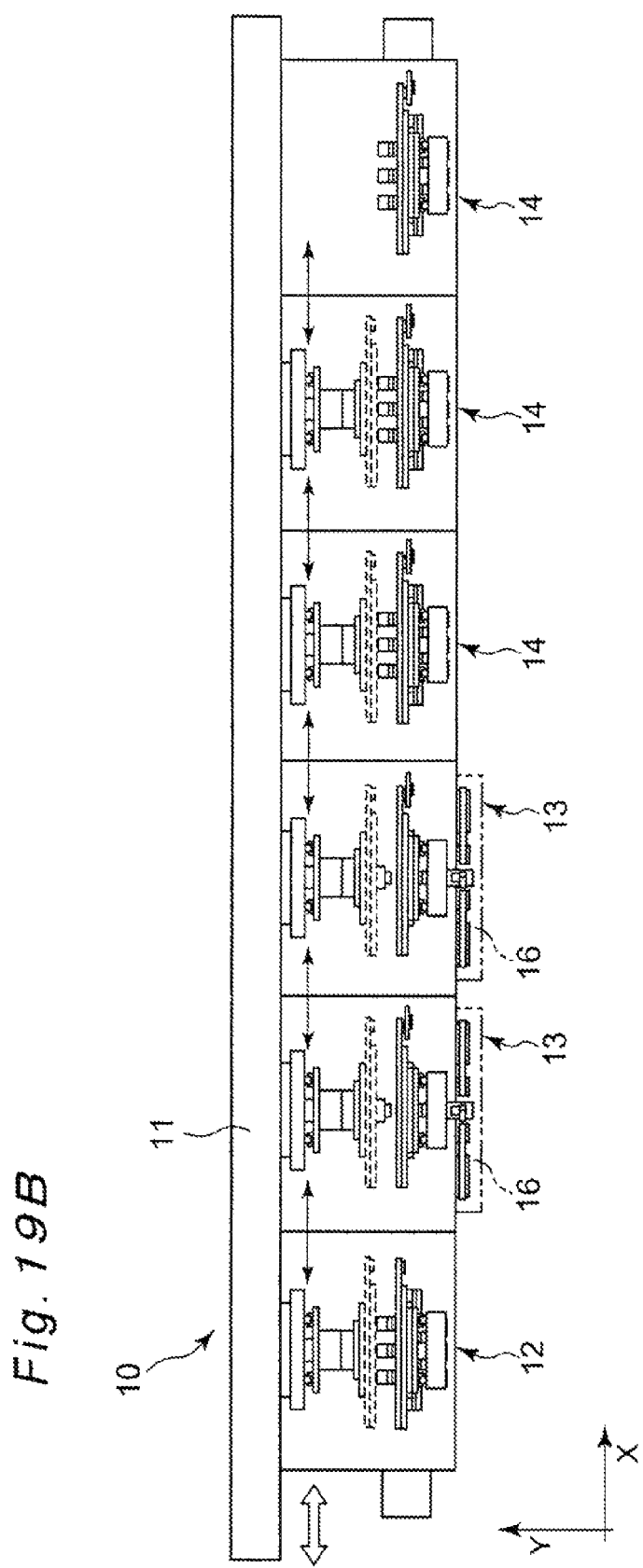

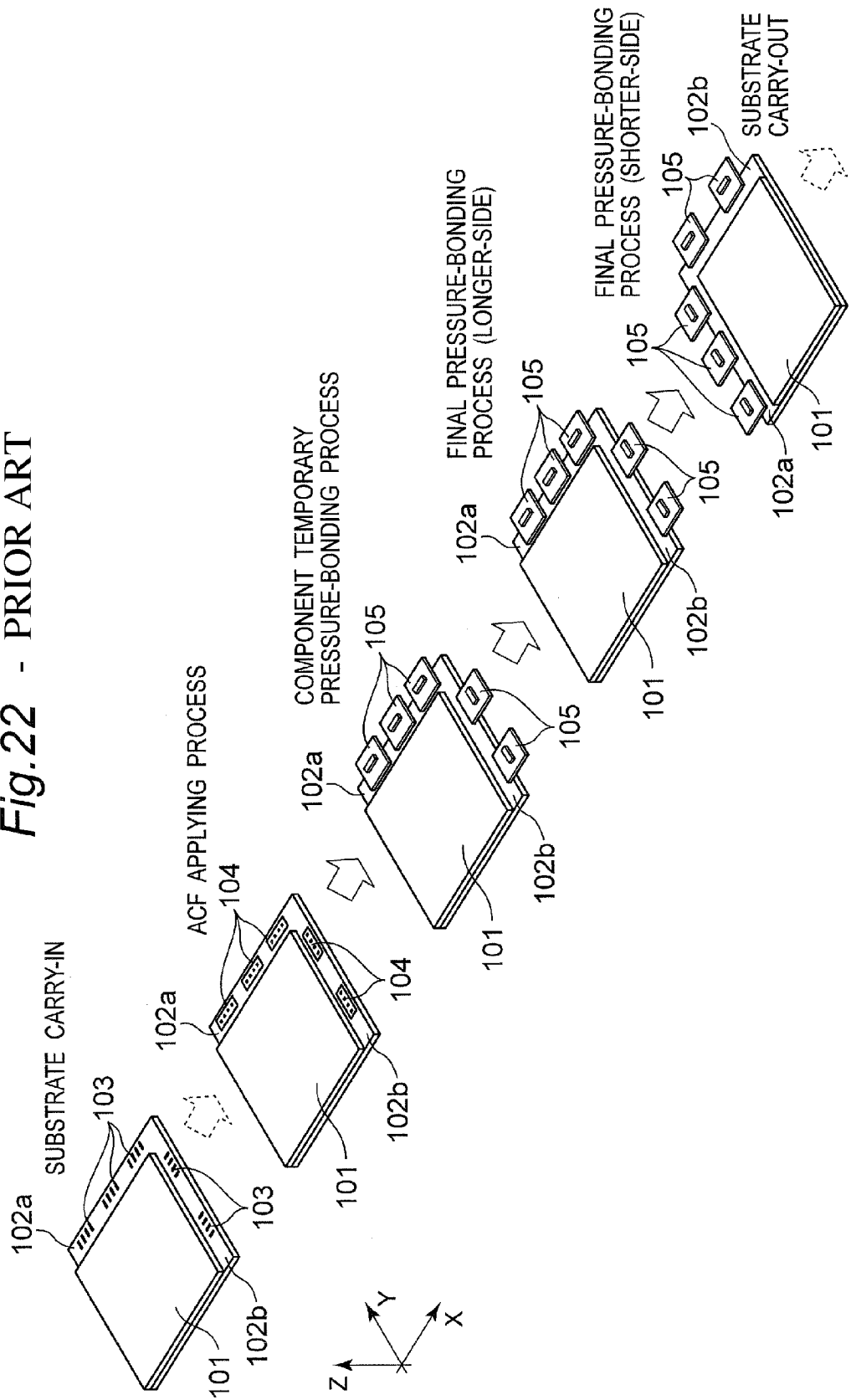

COMPONENT MOUNTING APPARATUS AND METHOD

TECHNICAL FIELD

The present invention relates to a component mounting apparatus and method for mounting various components onto a base board or substrate having mounting areas in its edge portions, such as glass substrates for liquid crystal displays or plasma displays.

BACKGROUND ART

In an LCD (Liquid Crystal Display) or PDP (Plasma Display Panel), TCP (Tape Carrier Package) components, COF (Chip On Film) components, COG (Chip On Glass) components, FPC (Flexible Printed Circuit) boards, other electrical components, mechanical components, optical components and the like are mounted in a mounting area provided in edge portions of a glass substrate of the panel during the manufacture of a display device.

Conventionally, as an example, a method for mounting components 105 to a plurality of mounting areas (mounting positions) 103 in two edge portions 102a, 102b which are located on a longer-edge side and a shorter-edge side of a substrate 101 is now described with reference to a schematic explanatory view shown in FIG. 22. Referring to FIG. 22, as the substrate 101 is carried in, first performed is an ACF applying process for applying anisotropically conductive films (hereinafter, referred to as ACFs) 104 onto each of mounting areas 103 of the substrate 101 having electrodes for electrical junction with component electrodes. Next performed is a component temporary pressure-bonding process for setting and temporarily pressure-bonding the components 105 on the ACFs 104 applied to the individual mounting areas 103 of the substrate 101. This is followed by a final pressure-bonding process for pressure-bonding and fixing (i.e., finally pressure bonding) the components 105 by applying pressing force and heat to the components 105 that have been temporarily pressure-bonded on each of the longer-edge side and shorter-edge side mounting areas 103 of the substrate 101, while electrically connecting the electrodes of the components 105 and the electrodes of the substrate 101, respectively. By these processes being carried out, the components 105 are mounted and then the substrate 101 is carried out toward a succeeding-processing apparatus, as is known as a component mounting method.

Also, a component mounting apparatus for carrying out such component mounting processes as shown above includes an ACF applying device for performing the ACF applying process, a component temporary pressure-bonding device for performing the component temporary pressure-bonding process, a component final pressure-bonding device for performing the component final pressure-bonding process on the longer-edge side and shorter-edge side edge portions, and a conveyor device for conveying the substrate between these working devices (i.e., between the ACF applying device, the component temporary pressure-bonding device and the component final pressure-bonding device). Also, the working devices each include a working unit for performing their respective specified work, and a moving device for, upon reception of the substrate fed from the conveyor device on a substrate holder, positioning the mounting areas of the substrate to their corresponding working positions for the working units (see, e.g., Japanese Patent No. 3781604).

In such a conventional component mounting apparatus as described above, a flat plate-shaped substrate is conveyed with its flat-plate surface horizontal. In each of the working devices, movement and positioning of the substrate is performed by the moving device with a generally central portion of the substrate held from below by a substrate holder, while the working unit performs specified work with top surfaces of the mounting areas in edge portions of the substrate with the edge portions placed and held on a support base.

In addition, as is also known, for conveyance of a large-scale thin plate material such as a glass substrate for use in display panels or the like, the substrate in its generally vertical posture is supported at its lower end edge by a string of rollers so as to be drivable for movement, while a heightwise central portion of the substrate is levitatedly supported from its back face side by a levitational chamber that forms a fluid film of hydrostatic gas against the substrate back face, and moreover a gas stream is jetted diagonally downward from a gas blow-off nozzle toward the substrate top face side, by which the substrate is conveyed with its plate surface kept in a stable posture out of contact (see, e.g., Unexamined Japanese Patent Application Publication No. 2004-123254).

As another known mounting apparatus for mounting components onto a printed circuit board, in order that its horizontal placement area is reduced and double side mounting can be achieved without reversing the substrate, upper and lower side edges of the substrate are movably supported along guide rails, respectively, while an engagement member provided in the moving device is engaged with a rear end of the board to drive the movement of the board. At a specified position, a positioning pin is fitted to a positioning hole provided in the board to perform positioning of the board, and components to be inserted are inserted from the top face side of the board and then fixed by a clinch mechanism set on the back face side (see, e.g., Examined Japanese Utility Model Application No. H2-9599).

In recent years, there is an increasing trend toward larger scales of the substrate for display panel use. Therefore, as in Japanese Patent No. 3781604 or in FIG. 22, with the constitution of the component mounting apparatus for mounting components at edge portions of the substrate, in which the substrate is conveyed in a horizontal posture by the conveyor device and specified work is carried out with the edge portions of the horizontal-postured substrate positioned in specified positions in each of the working devices, there is a problem that the apparatus construction becomes larger-scaled, causing the equipment installation area to be larger. Besides, as another problem, the equipment cost to meet higher-accuracy demands in the component mounting becomes even higher together with the increasing scale of each machinery equipment.

Also, because the substrate has been becoming smaller in plate thickness, the substrate sags by its own weight, as it occurs increasingly at its portions further away from its supported portions (e.g., central portion of the substrate) during movement and positioning of the substrate in the horizontal-postured conveyance of the substrate. In such a case, there arises a need for avoiding interference between the substrate and its surrounding members with each other during the movement and positioning of the substrate or for performing a positioning to correct any sag of the substrate to implement high-accuracy position recognition. This requires more time for movement and positioning of the substrate, making an obstacle to improvement in the production cycle time of component mounting.

Unexamined Japanese Patent Application Publication No. 2004-123254 discloses a constitution in which the substrate is conveyed in a generally vertical posture to reduce the installation area of the conveyor device, and moreover in which the substrate can be conveyed while preventing peripheral edge portions of the substrate from making contact with any members other than the conveyor device and also from meandering. However, the substrate conveyance method disclosed in Unexamined Japanese Patent Application Publication No. 2004-123254 only covers the conveyance of a substrate, and solutions for the above-described problems for the substrate in component mounting apparatuses are neither disclosed nor suggested in Unexamined Japanese Patent Application Publication No. 2004-123254.

Further, Examined Japanese Utility Model Application No. H2-9599 describes a component mounting apparatus for mounting components onto a printed circuit board which is so constituted that components are mounted on the vertical-postured circuit board. However, Examined Japanese Utility Model Application No. H2-9599 only discloses a component mounting method in which the printed circuit board is conveyed with both upper and lower side edges supported by guide rails and, moreover, the board is positioned at a specified position on its conveyance path to perform component mounting. Therefore, the component mounting apparatus disclosed in Examined Japanese Utility Model Application No. H2-9599 is limited to mounting and conveyance of components for boards of high surface rigidity such as printed circuit boards and cannot be applied to substrates on which components are mounted in their edge portions. That is, Examined Japanese Utility Model Application No. H2-9599 neither discloses nor suggests any technique that can be applied to component mounting apparatuses for mounting components in edge portions of a substrate which is low in rigidity because of its large scale and thinness for use in display panels.

Accordingly, an object of the present invention, lying in solving the above-described problems, is to provide a component mounting apparatus and method which allow components to be mounted with high accuracy to edge portions of thin-type substrates or large-scale substrates having low surface rigidity typified by LCDs or PDPs or the like and moreover which allow the productivity of component mounting to be improved.

SUMMARY OF THE INVENTION

In order to achieve the above object, the present invention has the following constitutions.

According to a first aspect of the present invention, there is provided a component mounting apparatus comprising:

a conveyor device for sucking and holding a flat plate-shaped substrate in a substantially vertical posture and conveying the sucked and held substrate in a direction extending along its flat plate surface and moreover performing delivery of the substrate at a plurality of substrate delivery positions set along the substrate conveyance direction; and a plurality of working devices which are placed in correspondence to the plurality of substrate delivery positions of the conveyor device and which perform, in working positions, a working process for component mounting at a mounting area on which a component provided in edge portions of the substantially vertical-postured substrate received from the conveyor device are to be mounted, wherein each of the working devices comprises:

a substrate holder for, at the substrate delivery position of the conveyor device, sucking and holding the flat plate surface of the substrate except at least the mounting area of the lower-side edge portions of the substantially vertical-postured substrate;

a holder moving device for moving the substrate holder so that the substantially vertical-postured substrate is positioned at the substrate delivery position of the conveyor device and the working position;

a receiving member which is enabled to move the mounting area of the edge portions of the substrate positioned in the working position between a support position where the substrate is supported from its back face side that is opposite to the mounting area side and a withdrawal position withdrawn from the support position; and a working unit for performing a working process on the mounting area of the edge portions of the substrate positioned in the working position from its front face side that is the mounting area side.

According to a second aspect of the present invention, there is provided the component mounting apparatus according to the first aspect, wherein, in each working device, the holder moving device is a holder up/down device for moving up and down the substrate holder between the substrate delivery position of the conveyor device and the working position located lower than the substrate delivery position, and the working unit performs, in the working position, the working process for the mounting area provided in the lower-side edge portion of the substantially vertical-postured substrate.

According to a third aspect of the present invention, there is provided the component mounting apparatus according to the second aspect, wherein the conveyor device includes a plurality of substrate conveyor units which are, individually and independently, reciprocatively moved between the substrate delivery positions along a single conveyance path continued in a direction extending along the flat plate surface of the substrate, and each of the substrate conveyor units includes a conveyance substrate holder for sucking and holding the back face side of the substantially vertical-postured substrate.

According to a fourth aspect of the present invention, there is provided the component mounting apparatus according to the third aspect, wherein each of the substrate delivery positions in the conveyor device is located horizontally separate from the single conveyance path continued in the direction extending along the flat plate surface of the substrate, and each of the substrate conveyor units includes a horizontal-direction moving device for moving back and forth the conveyance substrate holder in a horizontal direction between the conveyance path and the substrate delivery position.

According to a fifth aspect of the present invention, there is provided the component mounting apparatus according to the fourth aspect, wherein each of the substrate conveyor units includes a rotating device for rotationally moving the conveyance substrate holder about a rotation axis orthogonal to the flat plate surface of the substrate.

According to a sixth aspect of the present invention, there is provided the component mounting apparatus according to the second aspect, wherein the plurality of working devices each include:

a bonding member applying device for applying a bonding member to a mounting area of the substrate;

a component temporary pressure-bonding device for temporarily pressure-bonding components via the bonding member applied to the mounting area of the substrate; and a final component pressure-bonding device for simultaneously heating and pressuring temporarily pressure-bonded components to the mounting area of the substrate to mount the components thereon.

According to a seventh aspect of the present invention, there is provided the component mounting apparatus according to the sixth aspect, wherein the component temporary pressure-bonding device includes:

a recognition device for, at a position in the mounting area of the substrate positioned in the working position in the substantially vertical posture or at a position substantially corresponding to the mounting area, recognizing positions of the mounting area of the substrate and the components; and a control device for controlling operations of the holder up/down device, the receiving member, the working unit, and the recognition device, and wherein the control device is operable to control operations of the holder up/down device, the receiving member, the working unit and the recognition device through the controlling of: by the holder up/down device, moving down the substrate from the substrate delivery position to position a lower-side edge portion of the substrate to a working position; by the recognition device, recognizing a position of a mounting area of the substrate from the back face side of the substrate; thereafter, by the up/down device, once moving up for withdrawal the substrate upward of the working position; then, by the working unit, positioning a component to be temporarily pressure-bonded to a component temporary pressure-bonding position; by the recognition device, recognizing the position of the component, and thereafter moving for withdrawal the component from the temporary pressure-bonding position; thereafter, by the up/down device, moving down the substrate to again permform positioning at the working position and moreover moving the receiving member to a position where the mounting area of the substrate is supported from the back face side of the substrate; thereafter, by the working unit, correcting the position of the component so that recognized positions of the mounting area of the substrate and the component become coincident with each other, in which state the component is temporarily pressure-bonded to the mounting area of the substrate.

According to an eighth aspect of the present invention, there is provided the component mounting apparatus according to the sixth aspect, wherein the component temporary pressure-bonding device includes:

a recognition device for, at a position in the mounting area of the substrate positioned in the working position in the substantially vertical posture or at a position substantially corresponding to the mounting area, recognizing positions of the mounting area of the substrate and the components; and a control device for controlling operations of the holder up/down device, the receiving member, the working unit, and the recognition device, and wherein the control device is operable to control operations of the holder up/down device, the receiving member, the working unit and the recognition device through the controlling of: by the working unit, positioning a component to be temporarily pressure-bonded to a component temporary pressure-bonding position; by the recognition device, recognizing the position of the component, and thereafter moving for withdrawal the component from the temporary pressure-bonding position; thereafter, by the holder up/down device, moving down the substrate from the substrate delivery position to position a lower-side edge portion of the substrate at the working position and moreover moving the receiving member to a position where the mounting area of the substrate is supported from the back face side; thereafter, by the recognition device, recognizing the position of the mounting area of the substrate from the back face side of the substrate; thereafter, by the working unit, correcting the position of the component so that recognized positions of the mounting area of the substrate and the component become coincident with each other, in which state the component is temporarily pressure-bonded to the mounting area of the substrate.

According to a ninth aspect of the present invention, there is provided the component mounting apparatus according to any one of the first through eighth aspects, further comprising, between the conveyor device and the working devices, an interruption device for inhibiting movement of any object between the two devices.

According to a tenth aspect of the present invention, there is provided a component mounting method comprising:

a conveyance process for sucking and holding a flat plate-shaped substrate in a substantially vertical posture by a conveyor device, conveying the sucked and held substrate in a direction extending along the flat plate surface and making delivery of the substrate at a plurality of substrate delivery positions set along a substrate conveyance direction;

working processes for, by working units placed in correspondence to the plurality of substrate delivery positions, respectively, performing process for component mounting at working positions for mounting area on which components provided in a lower-side edge portion of the substantially vertical-postured substrate are to be mounted;

each of the working processes includes:

a first working process for, at a substrate delivery position of the conveyor device, sucking and holding the flat plate surface of the substrate except at least the mounting area of the lower-side edge portion of the substantially vertical-postured substrate, and positioning the substrate, as it is in the substantially vertical posture, at a working position located lower than the substrate delivery position; and a second working process for moving a receiving member toward a back face of the substrate positioned at the working position, which is a surface opposite to the mounting area side surface of the substrate, and performing the working process from a front face side of the substrate for the mounting area of the substrate in a state that the mounting area of the substrate are supported by the receiving member from the back face side of the substrate.

EFFECT OF THE INVENTION

According to the component mounting apparatus of the invention, since the substrate is treated in a substantially vertical posture, apparatus construction and its installation area can be downsized so that the equipment cost can be reduced to a large extent. Also, since the substrate is delivered from the conveyor device to the working device for performing the mounting processes, the conveyor device does not need to meet any particular accuracy, and there is no need for providing any complex mechanism for securement of a flatness of the substrate or for performing such an operation even if the substrate is a thin-type or large-scale substrate having low surface rigidity. Accordingly, the flatness of the substrate can be maintained during the conveyance of the substrate or working process on the substrate, component mounting can be achieved at high positional accuracy with a simple apparatus construction.

According to the component mounting method of the invention, since the substrate is treated in a substantially vertical posture, apparatus construction necessary for carry out the component mounting method as well as its installation area can be downsized so that the equipment cost can be reduced to a large extent. Also, since the substrate is delivered from the conveyor device to the working device for performing the mounting processes, the conveyor device does not need to meet any particular accuracy, and there is no need for providing any complex mechanism for securement of a flatness of the substrate or for performing such an operation even if the substrate is a thin-type or large-scale substrate having low surface rigidity. Accordingly, the flatness of the substrate can be maintained during the conveyance of the substrate or working process on the substrate, component mounting can be achieved at high positional accuracy with a simple apparatus construction.

BRIEF DESCRIPTION OF DRAWINGS

These aspects and features of the present invention will become clear from the following description taken in conjunction with the preferred embodiments thereof with reference to the accompanying drawings, in which:

FIG. 1A is a conceptual view (plan view) showing a basic construction of a component mounting apparatus according to a first embodiment of the present invention;

FIG. 1B is a conceptual view (plan view) showing a basic construction of a component mounting apparatus according to a modification example of the first embodiment of the invention;

FIG. 2 is a perspective view showing component mounting process in the first embodiment;

FIG. 6B is an explanatory view of construction and operation of the ACF applying device in the component mounting apparatus of the first embodiment, the view being a side view for explaining an operation of applying an ACF with an edge portion of the substrate supported;

FIG. 12A is a side view showing a state of the substrate in the component mounting process of the first embodiment;

FIG. 12B is a side view showing a state of the substrate in component mounting process in a prior art example;

FIG. 13 is a front view showing a state of the substrate's rotational operation in the component mounting apparatus of the first embodiment;

FIG. 17 is a timing chart of operation processes of the final pressure-bonding unit in the final pressure-bonding device of the second embodiment;

FIG. 19A is a plan view for explaining an example of a use mode of a component mounting apparatus according to a fourth embodiment of the invention;

FIG. 19B is a plan view for explaining an example of the use mode other than that of FIG. 19A;

FIG. 22 is a perspective view showing component mounting process for horizontal substrates in a prior art example.

BEST MODE FOR CARRYING OUT THE INVENTION

Figure 3:
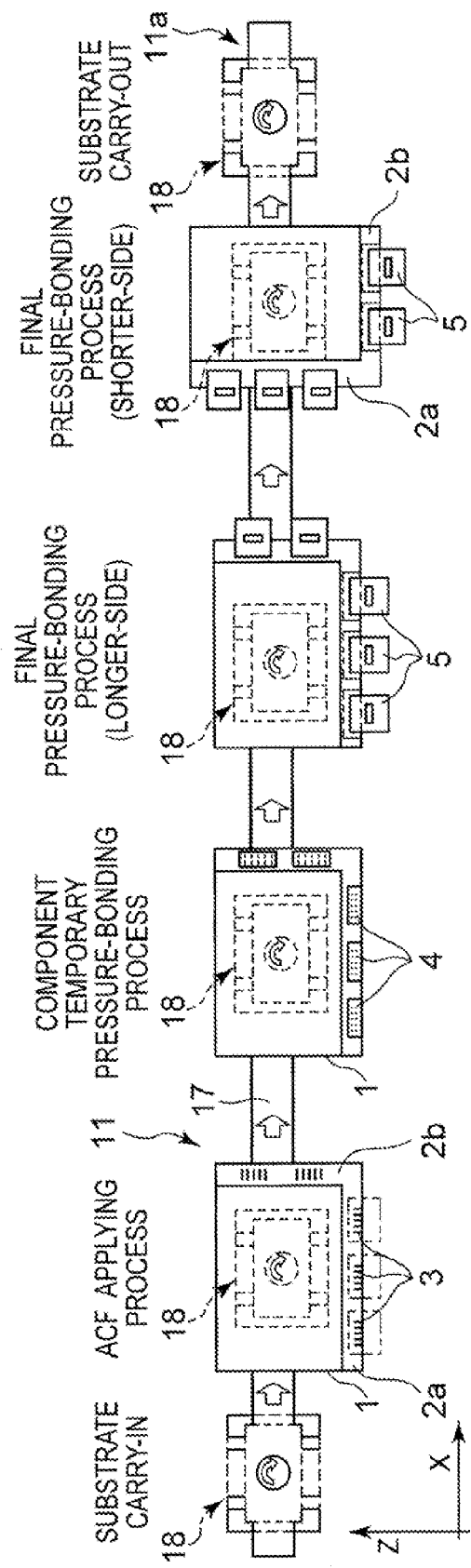
FIG. 3 is a front view of a conveyor device included in the component mounting apparatus of the first embodiment.

Before the description of the present invention proceeds, it is to be noted that like parts are designated by like reference numerals throughout the accompanying drawings.

Hereinbelow, embodiments in which the present invention is applied to component mounting apparatuses for mounting components such as TCPs and COFs onto substrates such as glass substrates of LCDs or PDPs will be described with reference to FIGS. 1A to 21.

First Embodiment

First, a component mounting apparatus according to a first embodiment of the invention is described with reference to FIGS. 1A to 13.

Referring to FIGS. 1A, 1B and 2, a substrate 1, which is the mounting object in this first embodiment, is formed into a flat plate shape by lamination of two glass plates which each have a rectangular shape having about several hundreds to 2000 mm long side lines and having a thickness of about 0.5 to 0.7 mm. Also, in the substrate 1, two edge portions 2a, 2b of mutually adjoining longer and shorter side lines are portions of only one glass plate protruding outwardly further than the other of the laminated two plates, and a plurality of mounting areas 3, which are areas where components are to be mounted, are placed on a surface of the one glass plate in the edge portions 2a, 2b. In each of the mounting areas 3, a plurality of connecting electrode portions formed by a multiplicity of connecting electrodes, which are transparent electrodes are placed in parallel at intervals at a fine pitch, and the mounting areas themselves are placed at intervals. When the substrate 1 is carried into the component mounting apparatus 10, the substrate 1 sucked and held in a substantially vertical posture by a conveyor device 11 is conveyed on a conveyance line 11a having a conveyance direction along the flat surface of the substrate 1 (conveyance process). It is noted that such a flat plate-shaped substrate 1 can also be referred to as, for example, 'panel substrate' or 'panel'.

While the substrate 1 is conveyed by the conveyor device 11, the component mounting apparatus 10 sequentially performs: an ACF applying process for applying an anisotropically conductive film (hereinafter, referred to as ACF) 4, which is a bonding member, to the individual mounting areas 3 provided in the edge portions 2a, 2b of the substrate 1; a component temporary pressure-bonding process for heating and pressuring and thereby temporarily pressure-bonding components 5 such as TCPs to the mounting areas 3 via ACFs 4 applied to the mounting areas 3; and a component final pressure-bonding process for heating and pressuring the temporarily pressure-bonded components 5 at a temperature and a pressure higher than those of the component temporary pressure-bonding process to connect connecting electrodes of the substrate 1 and the connecting electrodes of the components 5 to each other, respectively, and moreover hardening the ACFs 4 as they are so that the components 5 are fixed to the components 5. By these individual working processes being carried out in the component mounting apparatus 10, the components 5 are mounted on the mounting areas 3 in the edge portions 2a, 2b of the substrate 1, and the substrate 1 with the components 5 mounted thereon are carried out. In FIGS. 1A and 2, final pressure bonding of the components 5 temporarily pressure-bonded to the longer-side edge portion 2a, and the final pressure bonding of the components 5 temporarily pressure-bonded to the shorter-side edge portion 2b are implemented as different processes. However, instead, the final pressure bonding may be performed on the components 5 temporarily pressure-bonded to the longer-side edge portion 2a and shorter-side edge portion 2b by a single process as shown in FIG. 1B.

For implantation of the individual mounting processes as described above, an ACF applying device 12 for performing ACF applying processes, a component temporary pressure-bonding device 13 for performing component temporary pressure-bonding processes, and final pressure-bonding devices 14, 15 (see FIG. 1A) for performing component final pressure-bonding processes for the longer-side edge portion 2a and the shorter-side edge portion 2b, respectively, of the substrate 1 are placed in the component mounting apparatus 10 so as to be adjacent to one another along the conveyance direction (X-axis direction) of the conveyor device 11 that is a direction extending along the flat surface of the substrate 1. In addition, instead of the final pressure-bonding devices 14, 15 of FIG. 1A, a single final pressure-bonding device 14 (see FIG. 1B) for performing component final pressure-bonding processes for the longer-side edge portion 2a and the shorter-side edge portion 2b of the substrate 1 may be provided in the component mounting apparatus 10. Besides, in FIGS. 1A and 1B, a device denoted by reference sign 16 is a component feeding device included in the component temporary pressure-bonding device 13. In the following description, the ACF applying device 12, the component temporary pressure-bonding device 13 and the final pressure-bonding devices 14, 15 may also be referred to simply as working devices 12 to 15 when their common constitution or construction is involved. Also, in this first embodiment, the ACF applying processes, the component temporary pressure-bonding processes, and the final pressure-bonding processes are an example of working process for mounting the components 5 onto the substrate 1.

Figure 4:
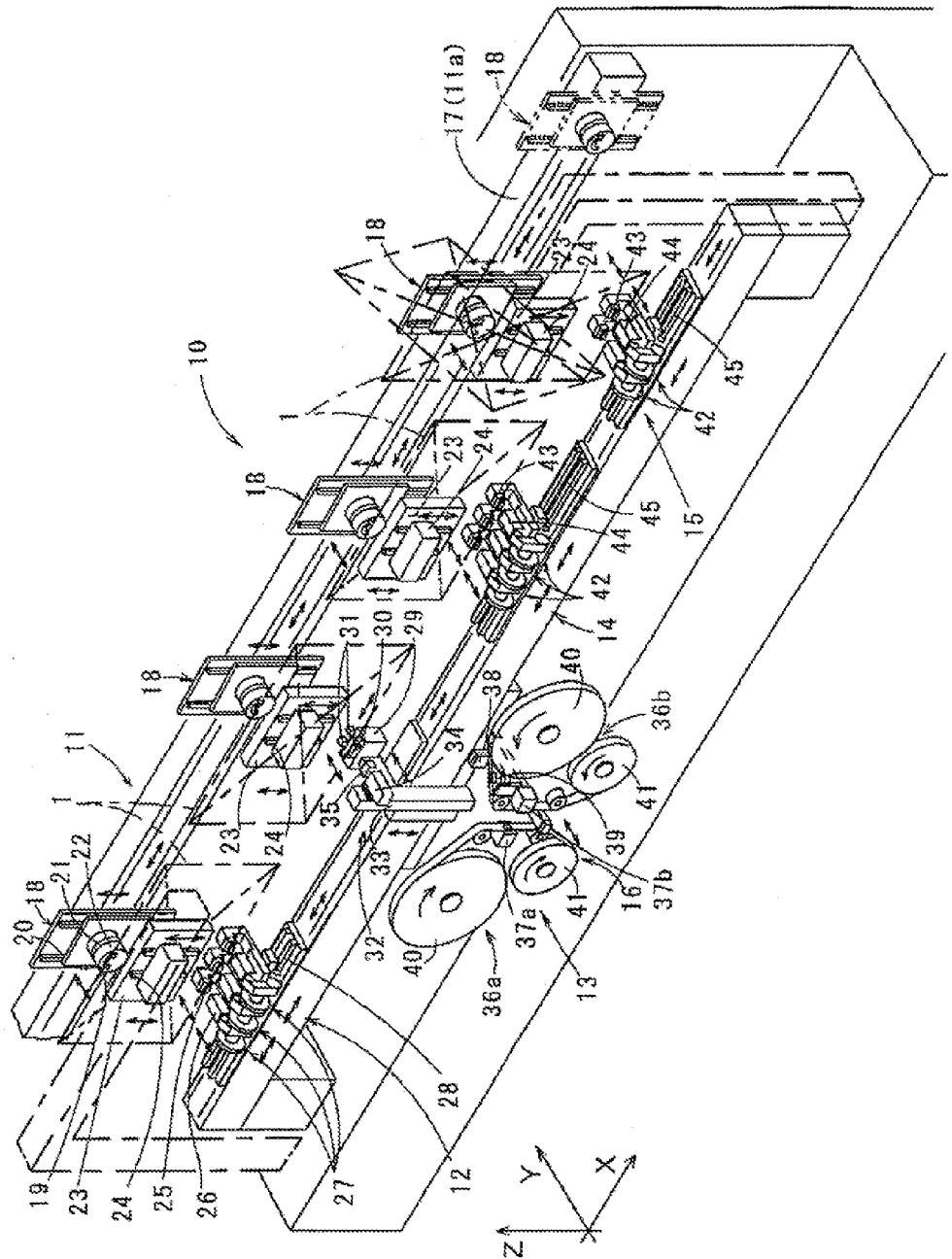
FIG. 4 is a perspective view showing an overall outlined construction of the component mounting apparatus of the first embodiment.
Figure 5:
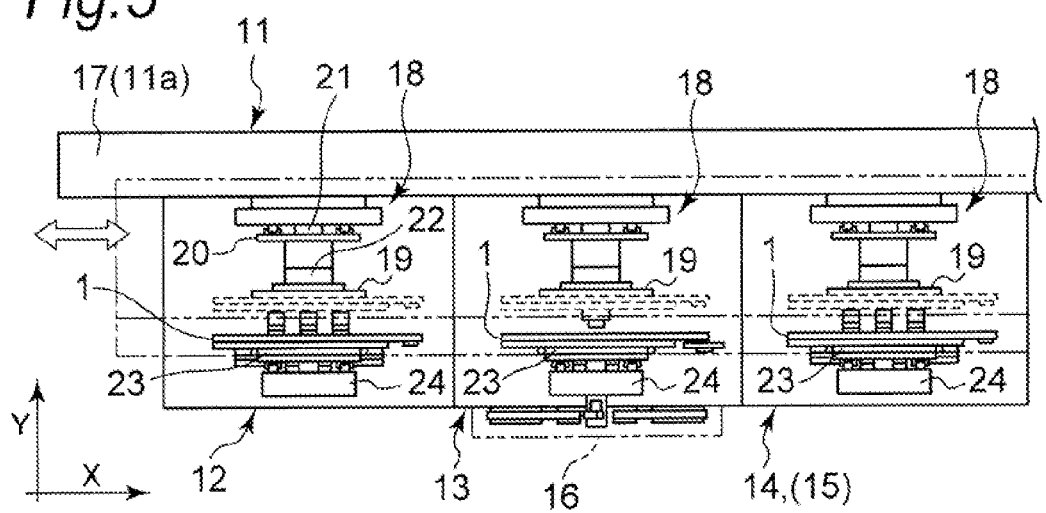
FIG. 5 is a plan view showing an outlined construction of the component mounting apparatus of the first embodiment.

In the conveyor device 11, as shown in FIGS. 3 to 5, a plurality of substrate conveyance units 18 that are reciprocatively movable independently of one another along a single continuous conveyance path-forming member 17 forming the conveyance line 11a are provided in correspondence to the working devices 12 to 15, respectively. Each one of the substrate conveyance units 18 is reciprocatively movable independently of the other substrate conveyance units 18 between a substrate carry-in position and substrate delivery positions and substrate carry-out positions opposed to the individual working devices 12 to 15, respectively.

As shown in FIGS. 7A, 7B, 8A, 8B and 9, each of the substrate conveyance units 18 includes: a conveyance substrate holder 19 for sucking and holding the substrate 1 in a substantially vertical posture; an up/down device 20 for moving and positioning the conveyance substrate holder 19 in a vertical direction, which is an up/down direction; a horizontal-direction moving device 21 for back-and-forth moving the conveyance substrate holder 19 toward the working device in the horizontal direction (i.e., Y-axis direction) so that the substrate 1 sucked and held by the conveyance substrate holder 19 is delivered to the working devices 12 to 15; and a rotating device 22 for rotating the conveyance substrate holder 19 forward and reverse within a rotational angle range of at least about 90 degrees about the horizontal axis (i.e., about a rotation axis orthogonal to the flat surface of the substrate 1). In FIGS. 7A, 7B, 8A, 8B and 9, reference sign 17a denotes an auxiliary guide member which is placed under the conveyance path-forming member 17 in parallel to the conveyance line 11a so as to movably support and guide a lower portion of the substrate conveyance unit 18 along the conveyance direction.

Figure 6A:
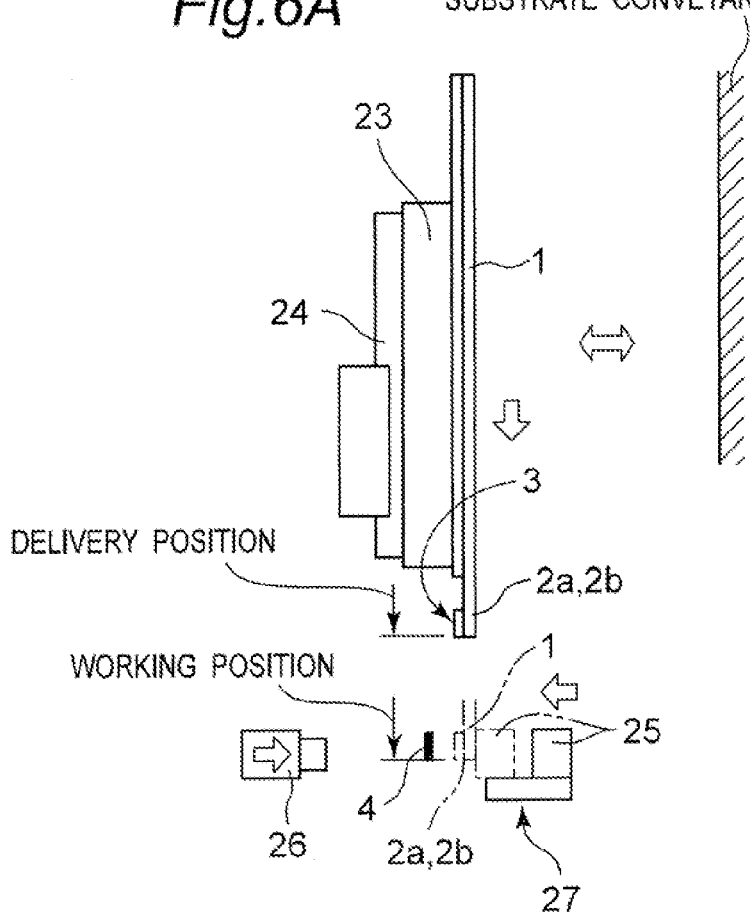
FIG. 6A is an explanatory view of construction and operation of an ACF applying device in the component mounting apparatus of the first embodiment, the view being a side view for explaining an operation of positioning a board to a working position.

Each of the working devices 12 to 15 includes a substrate holder 23 for holding the substantially vertical-postured substrate 1 delivered from the substrate conveyance unit 18 by sucking its flat surface of the substrate 1 except at least its mounting areas 3 of the edge portions 2a, 2b. Further, each of the working devices 12 to 15 includes a holder up/down device (an example of a holder moving device) 24 for moving up and down the substrate holder 23 so that the substrate 1 sucked and held by the substrate holder 23 is moved down from a substrate delivery position of reception from the substrate conveyance unit 18 shown by solid line to a downward working position shown by imaginary line (two-dot chain line) as shown in FIG. 6A and so positioned, and after completion of working process, further moved up to the substrate delivery position for the substrate conveyance unit 18. Construction and operation unique to the individual working devices 12 to 15 will be described below.

First, construction and operation of the ACF applying device 12 are described with reference to FIGS. 4, 6A, 6B, 7A and 7B. As shown in FIG. 6B, the ACF applying device 12 includes a plurality of ACF applying units (an example of working units) 27 each made up by a combination of: a receiving member 25 which is movable between a support position (solid line position in FIG. 6B) where the mounting areas 3 of the lower-side edge portion 2a or 2b of the substrate 1 positioned in the working position are supported from the back face side of the substrate 1 opposite to the mounting area 3 side and a withdrawal position (imaginary line (two-dot chain line) position in FIG. 6B) withdrawn from the support position; and an applying head 26 for applying the ACF 4 from the top surface side, i.e. mounting area 3 side, of the substrate 1 to the mounting areas 3 of the substrate 1 positioned in the working position. As the plurality of ACF applying units 27, as shown in FIG. 4, three ACF applying units 27 are included in the ACF applying device 12 in correspondence to the number of the mounting areas 3 in the longer-side edge portion 2a in the figure as an example. Further, in the ACF applying device 12, the individual ACF applying units 27 are supported so as to be movable individually and independently or individually by independent drive by a linear guide 28 along the edge portions 2a, 2b of the substrate 1 (i.e., along the X-axis direction), so that the plurality of ACF applying units 27 placed on the linear guide 28 can be moved by a linear motor (not shown) to change their placement intervals or positions, thereby being positioned.

Figure 7A:
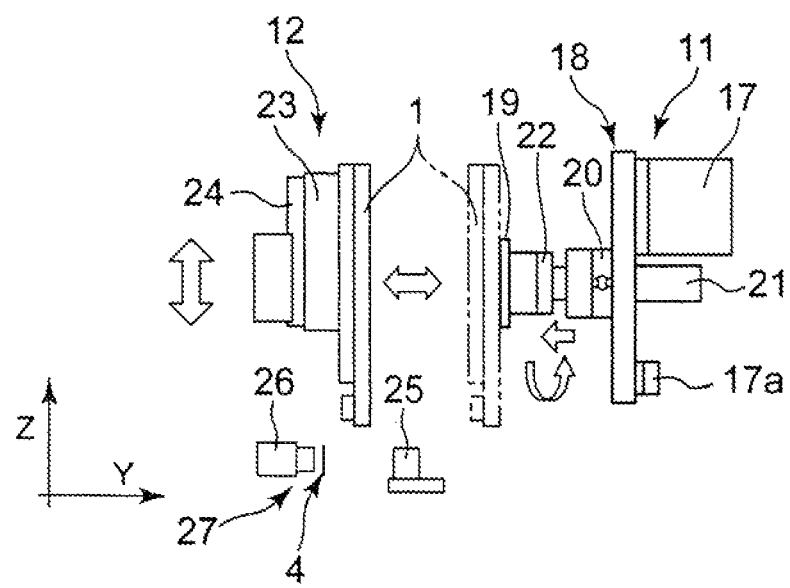
FIG. 7A is a view showing an operation process of the ACF applying device in the component mounting apparatus of the first embodiment, the view being a side view showing a substrate delivery process between the conveyor device and the ACF applying device.
Figure 7B:
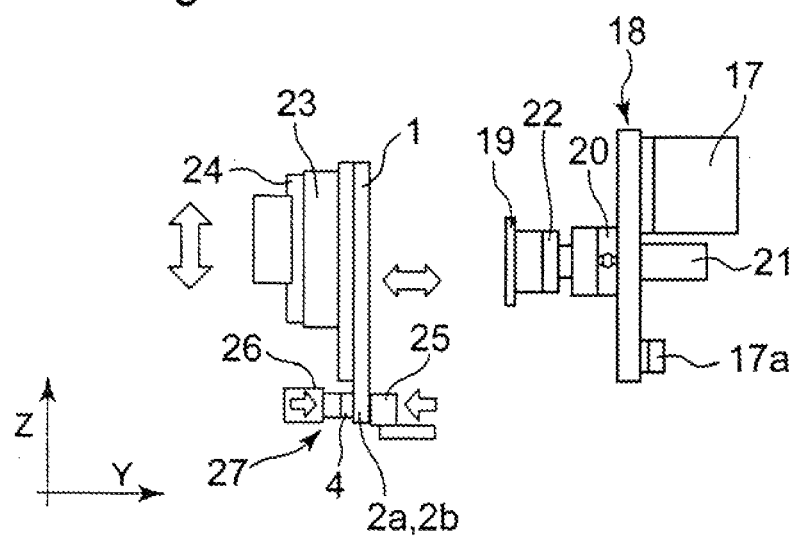
FIG. 7B is a view showing an operation process of the ACF applying device in the component mounting apparatus of the first embodiment, the view being a side view showing an ACF applying process.

In this ACF applying device 12, when the substrate 1 is received by the substrate holder 23 from the conveyor device 11 as shown in FIGS. 6A and 7A, the substrate 1 is moved down to the working position as shown in FIGS. 6B and 7B. Then, the ACF applying unit 27 is operated so that the substrate 1 is supported from its back face side of the mounting area 3 by the receiving member 25, in which state the ACF 4 is applied to the mounting area 3 from the top face side by the applying head 26. In this operation, in the first embodiment, as shown in FIGS. 3 and 4, the ACFs 4 are applied at a time or successively to the three mounting areas 3 provided in the longer-side edge portion 2a, which is one of the edge portions of the substrate 1, by the plurality of ACF applying units 27 that have been moved and positioned in opposition to the mounting areas 3, respectively. Thereafter, the substrate holder 23 is moved up from the working position to the substrate delivery position, where the substrate 1 is delivered to the conveyance substrate holder 19 of the conveyor device 11, and the conveyance substrate holder 19 is rotated by 90 degrees by the rotating device 22 so that the shorter-side edge portion 2b, which is the other edge portion of the substrate 1, is positioned on the lower side. Along with this, the up/down device 20 is operated so that the lower-side edge portion 2b is positioned at a specified height position in the substrate delivery position for delivery of the substrate 1 to the substrate holder 23. After that, the substrate 1 is delivered from the conveyor device 11 to the substrate holder 23 as shown again in FIGS. 6A and 7A, and the substrate 1 is moved down to the working position and so positioned as shown in FIGS. 6B and 7B, where the ACFs 4 are applied to the mounting areas 3 of the edge portion 2b in the same way as in the applying operation of the ACFs 4 to the edge portion 2a. In this process, in the first embodiment, since two mounting areas 3 are provided in the shorter-side edge portion 2b of the substrate 1, two out of the three ACF applying units 27 are placed opposite to the mounting areas 3, respectively, while the remaining ACF applying unit 27 is withdrawn into a sidewise position so as not to interfere with the substrate 1 and be kept out of operation. In such a state, the two ACF applying units 27 are operated to fulfill applying of the ACFs 4, and thereafter the substrate holder 23 is moved up to the substrate delivery position for the conveyance substrate holder 19, where the substrate 1 is delivered to the conveyance substrate holder 19 on the conveyor device 11 side. After that, for a conveyance posture of the substrate 1 for the succeeding process, the conveyance substrate holder 19 is rotated back by 90 degrees by the rotating device 22 in the conveyor device 11, and the substrate 1 is conveyed toward the succeeding-stage component temporary pressure-bonding device 13.

Next, construction and operation of the component temporary pressure-bonding device 13 are described with reference to FIGS. 4, 5, 8A and 8B. The component temporary pressure-bonding device 13 includes a movable base 29 which is set on the back face side of the mounting areas 3 of the lower-side edge portion 2a or 2b of the substrate 1 positioned in the working position and which can be moved in a direction along the lower-side edge portion 2a or 2b of the substrate 1 and thereby positioned to each of positions of the individual mounting areas 3 of the substrate 1. On this movable base 29 are mounted: a receiving member 30 which is formed by a transparent member such as quartz and which is back-and-forth movable between a support position where the edge portion 2a or 2b of the substrate 1 is supported from the back face side of the mounting areas 3 and a withdrawal position withdrawn from the support position; and a pair of recognition cameras 31 which are recognition devices for recognizing, through the transparent receiving member 30, position marks (not shown) provided at specified positions in each mounting area 3 and component 5. Also, in the component temporary pressure-bonding device 13, a component temporary pressure-bonding unit (an example of the working unit) 32 for temporarily pressure-bonding the components 5 (5a, 5b) fed from a component feeding device 16 to the mounting areas 3 in the edge portion 2a or 2b of the substrate 1 positioned at the working position is provided on the top surface side of the lower-side edge portion 2a or 2b of the substrate 1.

The component temporary pressure-bonding unit 32 includes a component feeding device 16 for feeding components 5 to be mounted on the mounting areas 3 of the substrate 1, and a temporary pressure-bonding head 35 for holding components 5 fed from the component feeding device 16, heating and pressuring the components 5 with interposition of the ACFs 4 in the mounting areas 3 of the lower-side edge portion 2a or 2b of the substrate 1 positioned at the working position to fulfill the temporary pressure bonding of the components 5. The component feeding device 16 includes a component delivery section 38 which is so placed that a component 5 extracted from a later-described taped component set can be delivered to the temporary pressure-bonding head 35, the component delivery section 38 being positioned lower than the working position. Also, the component temporary pressure-bonding unit 32 includes a two-axis robot 33 for moving the temporary pressure-bonding head 35 in both an X-axis direction extending along the lower-side edge portion 2a or 2b of the substrate 1 and a Z-axis direction which is the vertical direction. Moving the temporary pressure-bonding head 35 in the X-axis direction by the two-axis robot 33 allows the temporary pressure-bonding head 35 to be positioned relative to the individual mounting areas 3 in the lower-side edge portion 2a or 2b of the substrate 1. Also, moving the temporary pressure-bonding head 35 by the two-axis robot 33 allows the temporary pressure-bonding head 35 to be moved up and down between the mounting areas 3 in the lower-side edge portion 2a or 2b of the substrate 1 that has been positioned in the working position and the component delivery section 38 of the component feeding device 16. Further, the temporary pressure-bonding head 35 is rotatable about a rotating shaft along the Y-axis direction, which is a direction vertical to the flat surface of the substrate 1. Thus, since the temporary pressure-bonding head 35 is movable in the individual directions, a component 5 fed to the component delivery section 38 can be held by the temporary pressure-bonding head 35, subjected to a positional correction of the component 5 with high accuracy, and temporarily pressure-bonded by heating and pressuring, and temporarily pressure bonding, the component 5 to the mounting areas 3 of the edge portion 2a or 2b of the substrate 1 positioned in the working position.

The component feeding device 16 includes a component feeding unit 36a for feeding components 5a which are to be mounted on the longer-side (source side) edge portion 2a of the substrate 1, and a component feeding unit 36b for feeding components 5b which are to be mounted on the shorter-side (gate side) edge portion 2b. The component feeding unit 36a and the component feeding unit 36b are placed symmetrically on both sides in the X-axis direction with the lower end portion of the two-axis robot of the component temporary pressure-bonding unit 32 taken as a generally center, while component extracting portions 37a, 37b are placed opposite to each other at positions where the components 5a, 5b are extracted from their corresponding taped component sets which will be described later. The component feeding device 16 further includes a transfer head 39 for transferring the components (5a, 5b) extracted by the component extracting portions 37a, 37b, respectively, to the component delivery section 38. Each of the component feeding units 36a, 36b includes a feed reel 40 on which taped component sets having a multiplicity of components 5 (5a, 5b) held on holding tape are wound, and a winding reel 41 for collecting the holding tape from which the components 5 (5a, 5b) have been extracted via the component extracting portions 37a, 37b, where the taped component sets are sequentially fed in pitch to the component extracting portions 37a, 37b so as to allow the components 5 (5a, 5b) to be extracted. The transfer head 39 sucks and holds a component 5 (5a, 5b) extracted by either one of the component extracting portions 37a, 37b, and moves the component toward the component delivery section 38 to deliver the component to the component delivery section 38. The component delivery section 38 sucks and holds the fed component 5 (5a, 5b) until the component is delivered to the temporary pressure-bonding head 35.

Figure 8A:
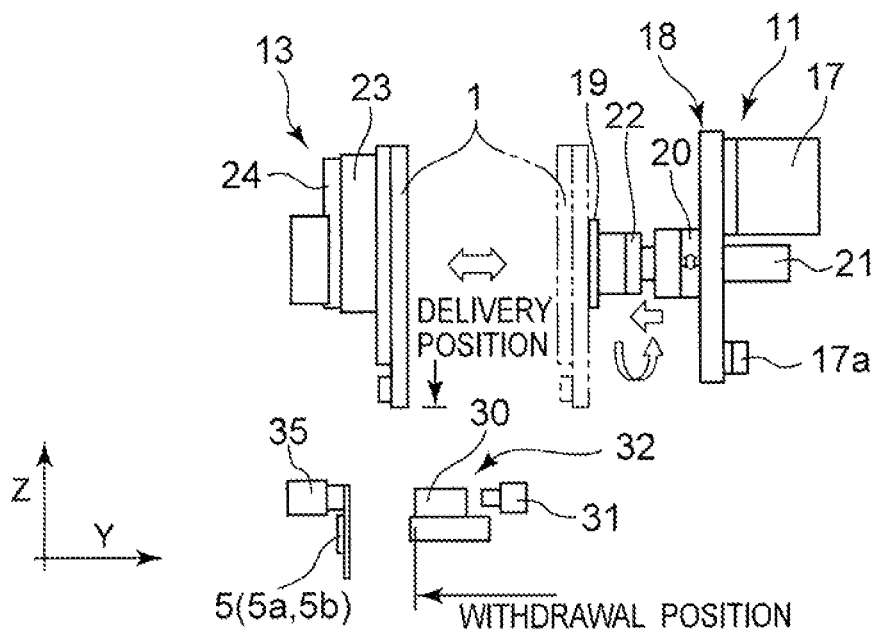
FIG. 8A is a view showing an operation process of the component temporary pressure-bonding device in the component mounting apparatus of the first embodiment, the view being a side view showing a substrate delivery process between the conveyor device and the component temporary pressure-bonding device.
Figure 8B:
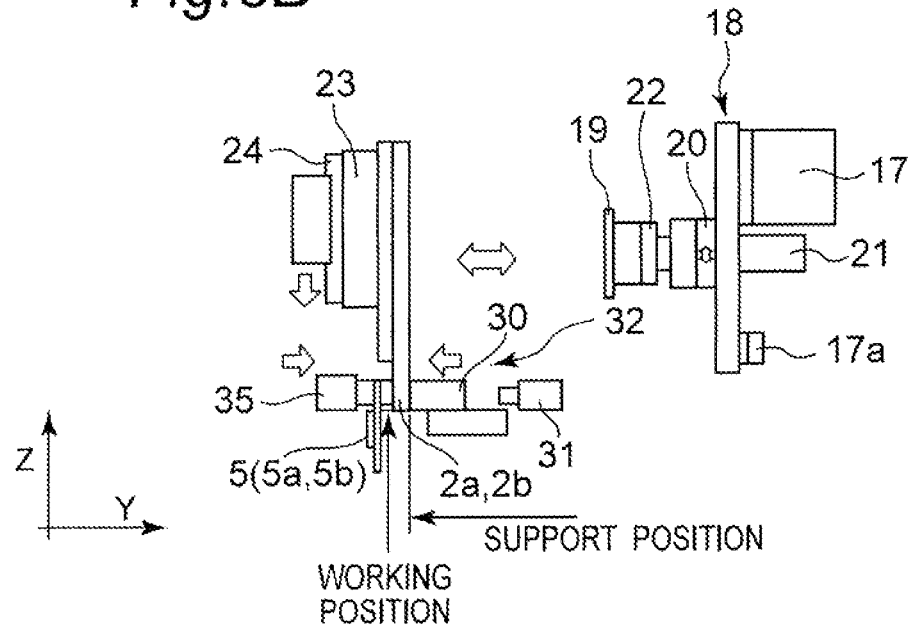
FIG. 8B is a view showing an operation process of the component temporary pressure-bonding device in the component mounting apparatus of the first embodiment, the view being a side view showing a component temporary pressure-bonding process.

In the component temporary pressure-bonding device 13, when the substrate 1 is received by the substrate holder 23 in the substrate delivery position from the conveyance substrate holder 19 of the conveyor device 11 as shown in FIG. 8A, the substrate 1 is moved down from the substrate delivery position to the working position by the holder up/down device 24 and so positioned as shown in FIG. 8B. Thereafter, while the substrate 1 is supported by the receiving member 30 from the back face side of the mounting areas 3 of the substrate 1, the component 5 is heated and pressured, thereby temporarily pressure-bonded, to the mounting area 3 from the top face side by the temporary pressure-bonding head 35 of the component temporary pressure-bonding unit 32. In more detail, when the substrate 1 is positioned to the working position, a position of the mounting area 3 in a flat surface direction of the substrate 1 (i.e., a position within the XZ plane) is recognized with high accuracy by the recognition camera 31 from the back face side of the mounting areas 3 of the substrate 1, and thereafter the substrate 1 is once moved up for withdrawal from the working position by the holder up/down device 24. In this operation, alternatively, the receiving member 30 may be moved up to the support position for support of the substrate 1 located in the working position, by which a position of the mounting area 3 of the substrate 1 is recognized by the recognition camera 31 while a position of the mounting area 3 of the substrate 1 in the thicknesswise direction of the substrate 1 is restricted to the support position, which is the position in the temporary pressure bonding. Next, the component 5 to be temporarily pressure-bonded to the mounting area 3 is moved to the temporary pressure-bonding position by the temporary pressure-bonding head 35 of the component temporary pressure-bonding unit 32, where the position of the component 5 is recognized with high accuracy by the recognition camera 31, and thereafter the component 5 is once moved and withdrawn from the temporary pressure-bonding position by the temporary pressure-bonding head 35. Next, the substrate 1 is positioned again to the working position by the holder up/down device 24, where based on positional information as to the first-recognized mounting area 3 and positional information as to the component 5, the position of the component 5 is corrected by the temporary pressure-bonding head 35 so that the position of the mounting area 3 and the position of the component 5 become coincident with each other, in which state the component 5 is heated and pressured so as to be temporarily pressure-bonded to the mounting area 3 of the substrate 1 by the temporary pressure-bonding head 35.

The procedure for temporary pressure bonding of the components 5 to the mounting areas 3 of the substrate 1 is not limited to such a method only, and other various methods are adoptable. For example, the operation that while the substrate 1 is moved down from the substrate delivery position to the working position and so positioned by the holder up/down device 24 and while the substrate 1 is supported from the back face side of the mounting areas of the substrate 1 by the receiving member 30, the component 5 is temporarily pressure-bonded from the top face side by the temporary pressure-bonding head 35 of the component temporary pressure-bonding unit 32 may be an operation procedure. First, the component 5 to be temporarily pressure-bonded to the mounting area 3 is moved to the temporary pressure-bonding position by the temporary pressure-bonding head 35 and a position of the component 5 is recognized with high accuracy by the recognition camera 31, and then the component 5 is once moved and withdrawn from the temporary pressure-bonding position by the temporary pressure-bonding head 35. Thereafter, the lower-side edge portion 2a or 2b of the substrate 1 is moved down from the substrate delivery position to the working position by the holder up/down device 24, and the receiving member 30 is moved to a position where the back face side of the mounting areas 3 of the substrate 1, where a position of the mounting area 3 in the flat-surface direction of the substrate 1 is recognized with high accuracy from the back face side of the mounting areas 3 by the recognition camera 31. In addition, in this case, after the position recognition of the mounting area 3, the mounting area 3 of the substrate 1 may be supported from its back face side by the receiving member 30. Next, based on positional information as to the recognized mounting area 3 and positional information as to the component 5, the position of the component 5 is corrected by the temporary pressure-bonding head 35 so that the position of the mounting area 3 and the position of the component 5 become coincident with each other, in which state the component 5 is heated and pressured so as to be temporarily pressure-bonded to the mounting area 3 of the substrate 1 by the temporary pressure-bonding head 35. By taking such an operation procedure, time for once moving up and withdrawing the substrate 1 upward by the holder up/down device 24 after the position recognition of the mounting area 3 of the substrate 1 as well as the time for positioning the substrate 1 again to the working position can be reduced.

Upon completion of the temporary pressure bonding of the component 5 to one mounting area 3 in an edge portion as shown above, the movable base 29 with the receiving member 30 and the recognition camera 31 mounted thereon as well as the component temporary pressure-bonding unit 32 are moved to a position opposite to the succeeding mounting area 3, where the component temporary pressure-bonding operation is performed by the above-described procedure. It is noted that, although the component temporary pressure-bonding unit 32 and the movable base 29 are provided as separate members, these members may also be provided as an integral unit and moved to the position corresponding to the mounting area 3 of the substrate 1. This operation is repeated until the temporary pressure bonding of the component 5 (5a) for all the mounting areas 3 of the lower-side edge portion 2a, which is one of the edge portions of the substrate 1, is completed. Next, the substrate holder 23 is moved up from the working position to the substrate delivery position, where the substrate 1 is delivered to the conveyance substrate holder 19 on the conveyor device 11 side, and the conveyance substrate holder 19 is rotated by 90 degrees by the rotating device 22 so that the shorter-side edge portion 2b, which is the other edge portion of the substrate 1 is positioned on the lower side. Thereafter, the up/down device 20 is operated so that the lower-side edge portion 2b of the substrate 1 is positioned at a specified height position in the substrate delivery position. Next, as shown in FIG. 8A, the substrate holder 23 in the substrate delivery position is delivered again from the conveyor device 11 to the substrate holder 23, where the substrate 1 is moved down to the working position and so positioned as shown in FIG. 8B and the components 5 (5b) are temporarily pressure-bonded to all the mounting areas 3 of the shorter-side edge portion 2b of the substrate 1 in the same way as described above. Thereafter, the substrate holder 23 is moved up from the working position to the substrate delivery position, and the substrate 1 is delivered to the conveyance substrate holder 19 of the conveyor device 11. After that, for a conveyance posture for the succeeding process, the conveyance substrate holder 19 is rotated back by 90 degrees by the rotating device 22 in the conveyor device 11, and the substrate 1 is conveyed toward the succeeding-stage final pressure-bonding device 14.

Next, construction and operation of the final pressure-bonding device 14 are described with reference to FIGS. 4, 5, 9, 10, 11A and 11B. The final pressure-bonding device 14, as shown in FIGS. 4 and 5, includes a plurality of final pressure-bonding units (an example of working units) 42 each of which is made up by a combination of: a receiving member 43 which is movable between a support position where the mounting areas 3 of the lower-side edge portion 2a of the substrate 1 positioned in the working position are supported from the back face side and a withdrawal position withdrawn from the support position; and a final pressure-bonding head 44 for heating and pressuring the component 5 temporarily pressure-bonded to the mounting area 3 of the substrate 1 at a temperature and a pressure higher than those in the temporary pressure bonding, thereby pressure-bonding (finally pressure-bonding) the component 5. As the plurality of final pressure-bonding units 42, as shown in FIG. 4, three final pressure-bonding units 42 are included in the final pressure-bonding device 14 in correspondence to the number of the mounting areas 3 in the lower-side edge portion 2a of the substrate 1 in the figure as an example. Further, in the final pressure-bonding device 14, these final pressure-bonding units 42 are supported so as to be movable individually and independently or individually by independent drive by a linear guide 45 along the edge portion 2a of the substrate 1 (i.e., along the X-axis direction), so that the plurality of final pressure-bonding units 42 placed on the linear guide 45 can be moved by a linear motor (not shown) to change their placement intervals or positions, thereby being positioned.

Figure 9:
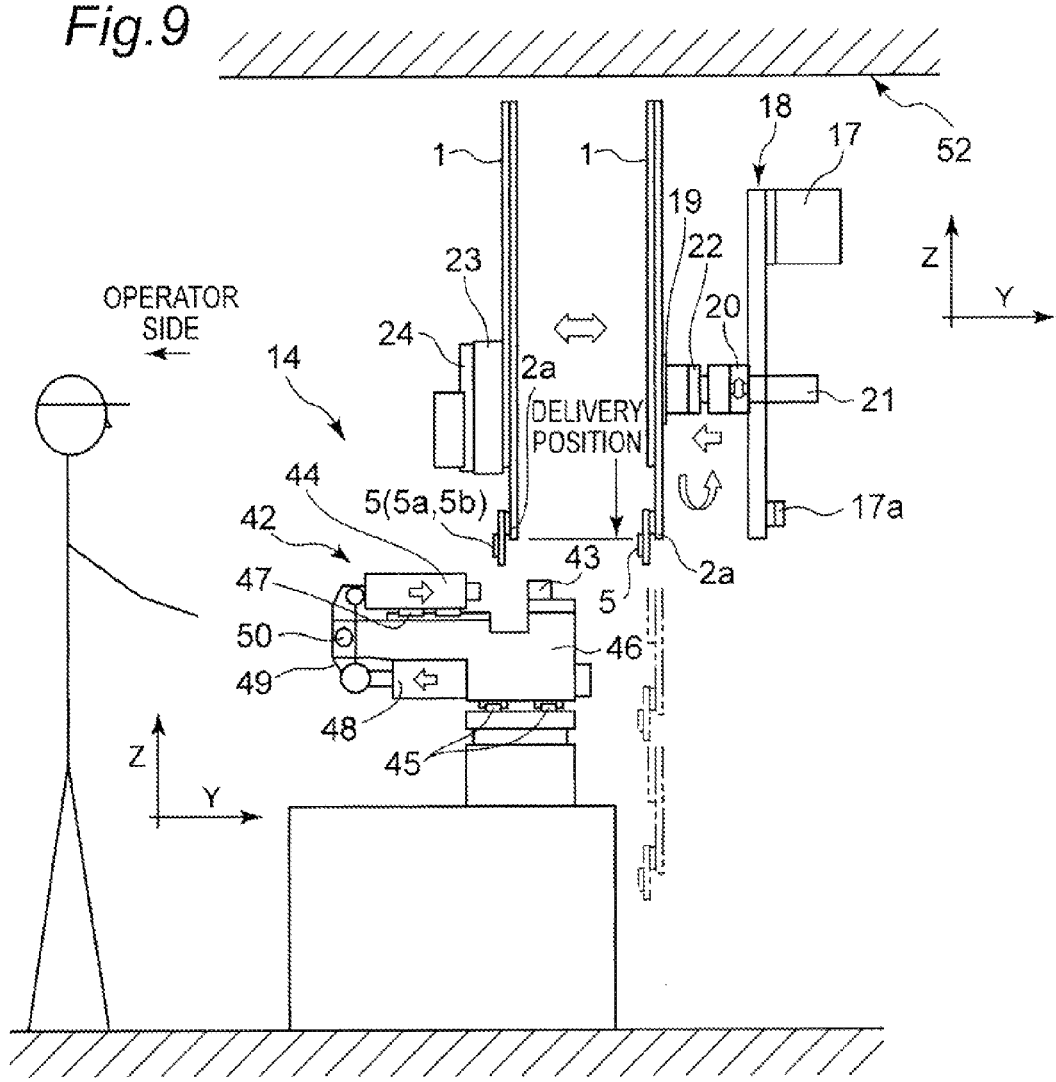
FIG. 9 is a side view of the final pressure-bonding device included in the component mounting apparatus of the first embodiment.
Figure 10:
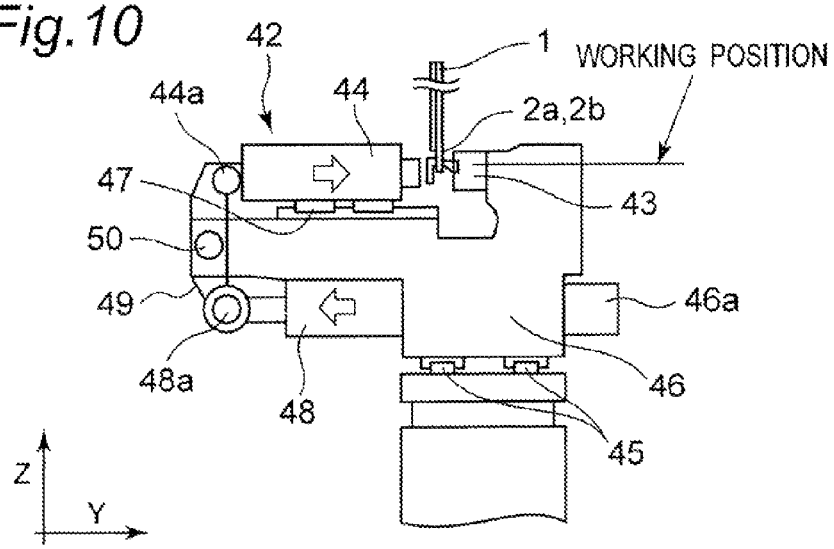
FIG. 10 is a side view of a final pressure-bonding unit in the final pressure-bonding device of the first embodiment.

A more concrete construction of the final pressure-bonding device 14 is described with reference to FIGS. 9, 10, 11A and 11B. Each of the final pressure-bonding units 42 includes a movable support base 46 which is movable and positionable individually and independently or individually by independent drive along the direction of the linear guide 45 (i.e., X-axis direction), which is a direction extending along the flat surface of the substrate 1. On top of the movable support base 46 are mounted: a receiving member 43 for supporting, from the back face side, the mounting areas 3 of the lower-side edge portion 2a of the substrate 1 positioned in the working position, and a final pressure-bonding head 44 for heating and pressuring the temporarily pressure-bonded components 5 on the front face side. The receiving member 43 is back-and-forth movable between a support position and a withdrawal position, and the pressure-bonding head 44 is so mounted as to be back-and-forth movable relative to the receiving member 43 (i.e., along the Y-axis direction) by a slide guide 47. Under the movable support base 46, a cylinder device 48 is placed so as to be positioned downward of the final pressure-bonding head 44, where a piston rod end 48a of the cylinder device 48 and a rear end 44a of the final pressure-bonding head 44 on one side opposite to the edge portion 2a side of the substrate 1 are rotatably coupled to upper and lower ends of a swing link 49 swingably supported by a pivotal shaft 50 having an intermediate portion provided on the movable support base 46. As a result of this, back-and-forth moving operations of the cylinder device 48 along the Y-axis direction allows the final pressure-bonding head 44 to be back-and-forth operated via the swing link 49 in the Y-axis direction so that final pressure-bonding operation can be achieved by the final pressure-bonding head 44. It is noted that reference sign 46a in FIG. 10 is a motor which is provided in the movable support base 46 and which moves and positions the movable support base 46 via a rack and pinion mechanism (not shown) or the like.

Figure 11A:
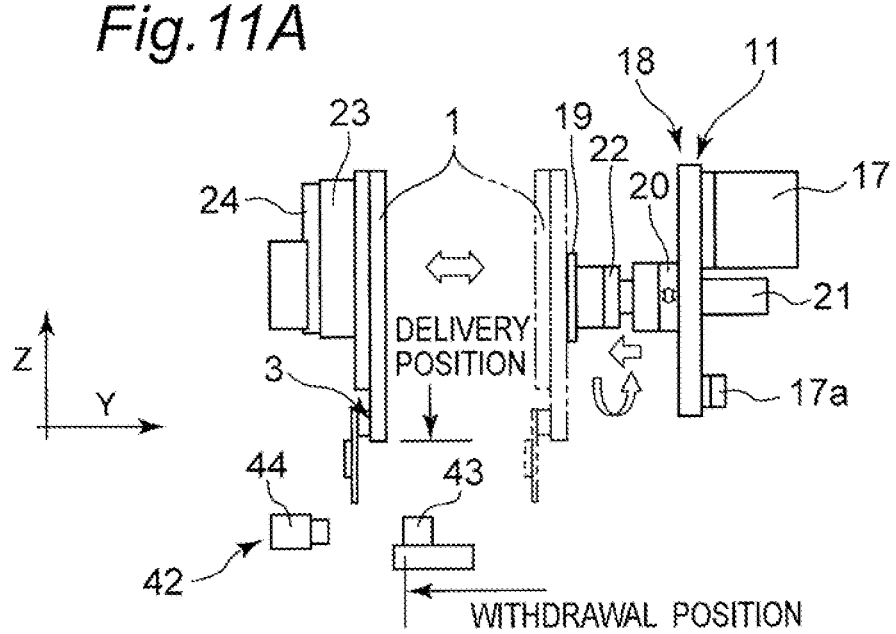
FIG. 11A is a view showing an operation process of the final pressure-bonding device in the component mounting apparatus of the first embodiment, the view being a side view showing a substrate deliver process between the conveyor device and the final pressure-bonding device.
Figure 11B:
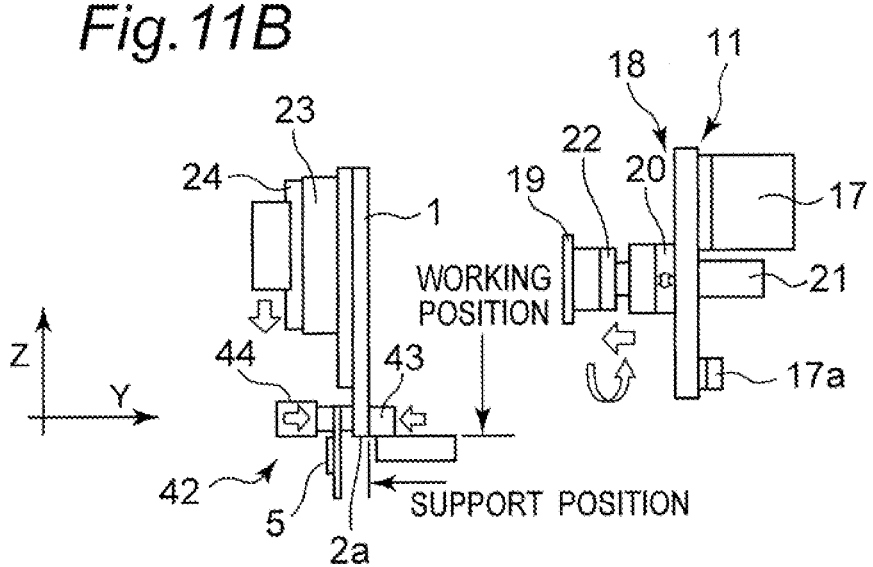
FIG. 11B is a view showing an operation process of the final pressure-bonding device in the component mounting apparatus of the first embodiment, the view being a side view showing a pressure bonding process.

In this final pressure-bonding device 14, as shown in FIG. 11A, when the substrate 1 is delivered from the conveyance substrate holder 19 of the conveyor device to the substrate holder 23 at the substrate delivery position, the substrate 1 is moved down to the working position for final pressure-bonding work of the component to the edge portion 2a of the substrate 1, and so positioned, as shown in FIG. 11B. Thereafter, the final pressure-bonding unit 42 is operated so that each of the mounting areas 3 of the lower-side edge portion 2a of the substrate 1 are supported from their back face side by the receiving member 43, in which state temporary pressure-bonding portion of the component 5 is heated and pressured, thereby finally pressure-bonded, from the front surface side by the pressure-bonding head 44. In this operation, in the first embodiment, as shown in FIGS. 3 and 4, three components 5 that are temporarily pressure-bonded to the lower-side edge portion 2a, which is one of the two edge portions of the substrate 1, are finally pressure-bonded at a time by the three final pressure-bonding units 42. Thereafter, the substrate holder 23 is moved up from the working position to the substrate delivery position, where the substrate 1 is delivered to the conveyance substrate holder 19 of the conveyor device 11 in the substrate delivery position, and the conveyance substrate holder 19 is rotated by 90 degrees by the rotating device 22 so that the shorter-side edge portion 2b, which is the other edge portion of the substrate 1, is positioned on the lower side. Along with this, the up/down device 20 is operated so that the lower-side edge portion 2b is positioned at a specified height position in the substrate delivery position for delivery of the substrate 1 to the substrate holder 23 in the succeeding process. Then, the substrate 1 is conveyed toward the succeeding process final pressure-bonding device 15.

The final pressure-bonding device 15, as shown in FIG. 4, is a device for finally pressure-bonding the components 5 temporarily pressure-bonded to the individual mounting areas 3 of the shorter-side edge portion 2b of the substrate 1 positioned at the working position. Differing from the final pressure-bonding device 14 in terms of construction, the final pressure-bonding device 15 includes two final pressure-bonding units 42 in correspondence to the number of mounting areas 3 of the shorter-side edge portion 2b. The rest of construction and operation are the same as in the final pressure-bonding device 14, its description being omitted. Also, the above-described conveyor device 11, the ACF applying device 12, the component temporary pressure-bonding device 13 and the final pressure-bonding devices 14, 15 are connected to a control unit (not shown) and controlled for their operation by the control unit so as to perform their individual operations described above.

According to the component mounting apparatus of the first embodiment, since the substrate 1 is conveyed and subjected to specified working process in a substantially vertical posture as shown in FIG. 12A, apparatus construction and installation area can be downsized in comparison to conventional component mounting apparatuses in which the substrate 1 is conveyed and subjected to working process in a horizontal posture as shown in FIG. 12B. Therefore, in component mounting apparatuses in which particularly large-scale substrates 1 are treated can be reduced in equipment cost to a large extent. Still, because of the substantially vertical posture of the substrate 1, there is almost no force that acts to cause the substrate 1 to bend in its thicknesswise direction (a direction orthogonal to the flat surface of the substrate 1) in its overall surface or peeled in the thicknesswise direction while the substrate 1 is sucked and held by the conveyance substrate holder 19 or the substrate holder 23. Therefore, even when the substrate 1 is a glass substrate for use in large-scale display panels as an example, it is achievable to reduce such fears that may adversely affect its display function.

Further, in this first embodiment, the substrate 1 is delivered in a substantially vertical posture between the conveyor device 11 and the working devices 12 to 15. In the working devices 12 to 15, the substrate 1 is received in a substantially vertical posture and positioned to the downward working position (first working process), and a lower-side edge portion of the substrate 1 is supported from its back face side by the receiving member 25, 30, 43 and, as it is, subjected to working process (second working process). In the case of the prior-art horizontal posture, on the other hand, the substrate 1 itself or the component 5 in its temporarily pressure-bonded or other state undergoes a flexure or sag due to their own weight as shown in FIG. 12B. In contrast to this, in the first embodiment, since the substrate 1, even if it is a large-scale or thin-type substrate having low surface rigidity, is treated in its substantially vertical posture, it never occurs that the weight of the substrate 1 acts to bend its flat surface. Accordingly, there is no need for providing any complex mechanism for securement of a flatness of the substrate 1 or for performing such an operation, so that the flatness of the substrate 1 can be maintained during the conveyance and working process as shown in FIG. 12A. Thus, components can be mounted to the mounting areas 3 provided in the edge portions 2a, 2b of the large-scale or thin-type substrate 1 having low surface rigidity at high positional accuracy with a simple apparatus construction.

Further, without any particularly high accuracy of the conveyor device 11, which involves a large-scale construction extending over the entire length of the component mounting apparatus 10, setting high accuracies of the individual working devices 12 to 15, particularly the component temporary pressure-bonding device 13 that is required to meet high accuracy allows high-accuracy component mounting to be fulfilled, so that high-accuracy mounting can be implemented with low-priced construction. As a result, the conveyor device 11 may also be made up by a combination of a plurality of structures divided in the conveyance direction so as to extend over the entire length of the component mounting apparatus. Besides, when the working process for the mounting areas 3 of one edge portion 2a or 2b of the substrate 1 is completed by the working devices 12 to 15, the substrate 1 is delivered from the working devices 12 to 15 to the conveyor device 11 and then the substrate 1 is rotated by 90 degrees on the conveyor device 11 side. Then, with a setting that the substrate delivery height is changeable in the conveyor device so that a lower end portion of a lower-side edge portion of the substrate or a lower end portion of the component temporarily pressure-bonded in a mounting area becomes equal to a reference height of the substrate delivery position for the working device, the individual working devices 12 to 15 are lowered by a specified nearly constant distance from the substrate delivery position to the working position, in which state the working process is carried out. Accordingly, the individual working devices 12 to 15 may be provided in simple and compact construction, thus making it implementable to cut down the apparatus cost. Further, in a case where component mounting for small-scale substrates is carried out with a component mounting apparatus for large-scale substrates in which the substrate is conveyed in a horizontal posture for component mounting as in the prior art, the substrate is positioned relative to the working device with its lower-face central portion side supported by the moving device in spite of the substrate's small scale, thus resulting in an increased move distance in the positioning operation. Besides, with the prior-art conveyance in the horizontal posture, the substrate is conveyed to the same conveyance distance as in the case of large-scale substrates, in which case although the process operation time needs to be reduced for small-scale substrates to enhance the productivity, yet the process operation time for positioning operation conversely becomes longer than that of large-scale substrates, posing a problem of worsened productivity. For this reason, for conventional apparatuses, there is a need for designing and manufacturing component mounting apparatuses in different specifications for large-scale substrates and small-scale substrates, respectively, posing a problem of involving enormous equipment costs. In contrast, in component mounting apparatuses in which the vertical-posture conveyance in the first embodiment is adopted, even if the substrate 1 is changed in size, the mounting work can be carried out in short time regardless of large or small sizes of the substrate 1, so that high productivity can be ensured in cases where component mounting is done for small-size to large-size substrates 1 with the same equipment.

Also in the first embodiment, when the working process for the mounting areas 3 of one edge portion 2a or 2b of the substrate 1 is completed by the working devices 12 to 15, the substrate 1 is delivered from the working devices 12 to 15 to the conveyance substrate holder 19 of the conveyor device 11, the substrate 1 is rotated by 90 degrees by the rotating device 22 on the conveyor device 11 side, and further the conveyance substrate holder 19 can be moved up and down by the up/down device 20. Therefore, adjusting the height position of the conveyance substrate holder 19 in the rotational operation makes it possible to ensure a specified safety distance d between an upper end of a maximum rotational radius locus 51 of the substrate 1 by the rotating device 22 and a ceiling surface 52 of the equipment as shown in FIGS. 9 and 13 even if the substrate 1 is a large-scale one. In such a case, a lower portion of the maximum rotational radius locus 51 passes a position which is lower than the upper end position of the working devices 12 to 15 (as an example, the final pressure-bonding device 14 is shown in FIG. 13) by a corresponding distance H. However, as shown in FIG. 9, the conveyor device 11 is located sideways on the opposite side (deeper side) of the working devices 12 to 15 relative to the operator's side in front of the working devices 12 to 15, there is no possibility of occurrence of interference in the rotation of the conveyor device 11 of the substrate 1 by the rotating device 22. Accordingly, as shown in FIG. 9 or 13, all that is required is to ensure a proper space for rotation of the substrate 1 under the conveyor device 11.

In component mounting apparatuses in which the substrate is conveyed in a horizontal posture for fulfillment of component mounting as in the prior art, the conveyor device and the working devices are large in horizontal-plane surface size, and moreover the working device moves the substrate received from the conveyor device by the moving device toward the working position of the working unit located far from the conveyor device and so position the substrate, thus involving larger distances from before the conveyor device to the working position of the working device or working unit. Thus, there is a problem of extremely worse workability in the maintenance of those devices or units, so that the machine equipment as a whole has to be stopped each time the maintenance of the working devices is done. In contrast to this, in the first embodiment, treatment of the substrate 1 in a substantially vertical posture leads to a smaller space between the operator side before the working devices 12 to 15 and the working devices 12 to 15 or to a smaller space between the conveyor device 11 and the working devices 12 to 15, so that the maintenance work can be carried out easily.

Second Embodiment

Next, a component mounting apparatus according to a second embodiment of the invention is described with reference to FIGS. 14 to 17. In the following description of the second embodiment, the same component members as in the foregoing embodiment are designated by the same reference signs with their detailed description omitted, and only differences will mainly be described below.

The component mounting apparatus of the second embodiment differs from the first embodiment only in the construction of the final pressure-bonding devices 14, 15, and moreover the final pressure-bonding device 14 and the final pressure-bonding device 15 are substantially identical in construction to each other as described above. Therefore, as a representative of the two final pressure-bonding devices 14, 15, the final pressure-bonding device for finally pressure-bonding two components 5 temporarily pressure-bonded to the shorter-side edge portion 2b of the substrate 1 is described.

Figure 14:
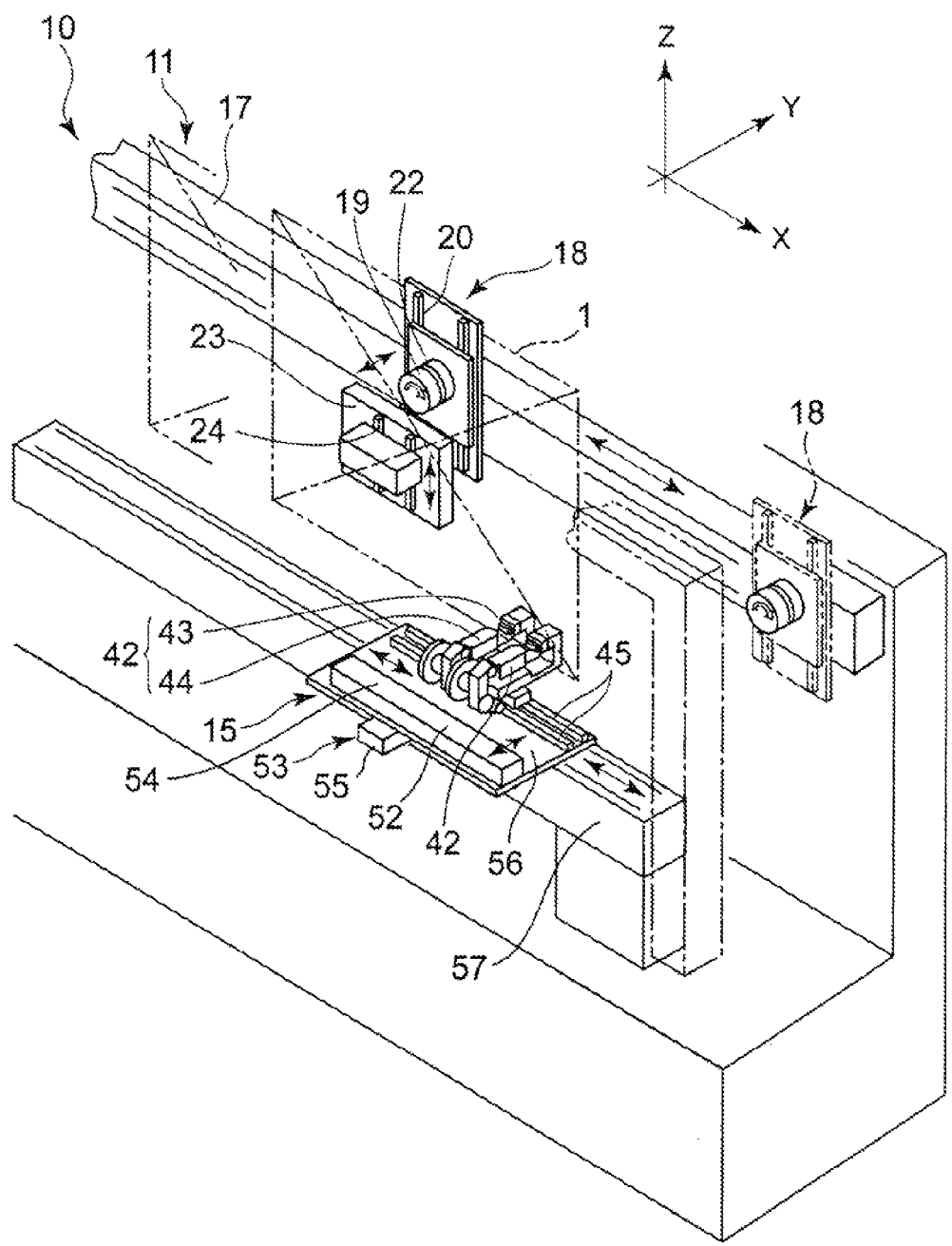
FIG. 14 is a perspective view of a final pressure-bonding device of a component mounting apparatus according to a second embodiment of the invention.
Figure 15:
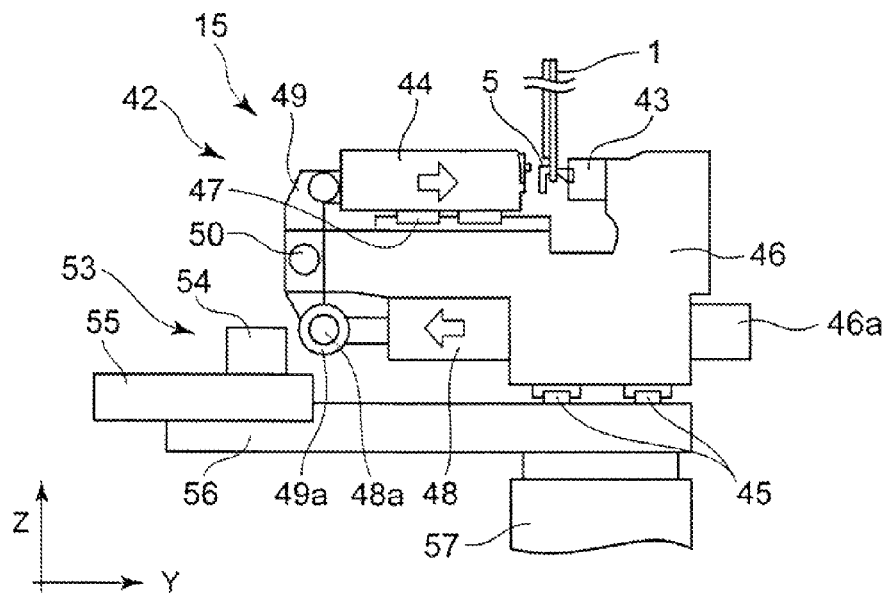
FIG. 15 is a side view of a final pressure-bonding unit included in a final pressure-bonding device in the component mounting apparatus of the second embodiment.

As shown in FIGS. 14 and 15, the final pressure-bonding device 15 of the second embodiment is provided with a speed control device 53 for controlling a press operation speed of the final pressure-bonding head 44 by the cylinder device 48 of each final pressure-bonding unit 42. The speed control device 53 concretely includes: a restricting member 54 with which a roller 49a is separably engaged in a back-and-forth direction (Y-axis direction in the figure) of the cylinder device 48, the roller 49a being fitted to a coupling portion between the piston rod end 48a and the swing arm 49 of the cylinder device 48 of each final pressure-bonding units 42; and a movement control device 55 for controlling movement of the restricting member 54 in the back-and-forth direction of the cylinder device 48. The final pressure-bonding unit 42 is moved and positioned by a motor 46a for driving in the sliding direction of the linear guide 45. The restricting member 54 is placed so as to extend over a length range nearly equal to a range over which the linear guide 45 extends in the X-axis direction. The linear guide 45 and the movement control device 55 are provided on a common base member 56 so that even if the final pressure-bonding units 42 is positioned at any position within the slide range in the X-axis direction, the restricting member 54 of the speed control device 53 functions as it is, i.e., is contactable with the roller 49a. Further, the base member 56 is placed movable and positionable in the X-axis direction on a support frame 57 which is placed so as to extend in the X-axis direction over a range (area) over which at least one working process of the working devices 12 to 15 is carried out along the conveyance direction of the substrate 1. Therefore, it is manageable to keep up with considerable changes in the size of the substrate 1 which involves large intervals of the mounting areas 3 of the edge portions 2a, 2b of the substrate 1.

Figure 16:
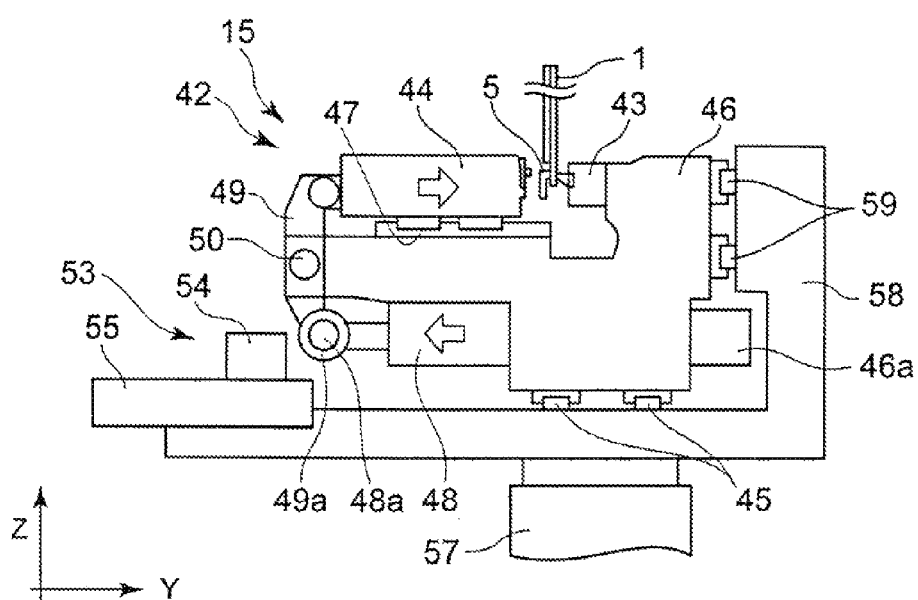
FIG. 16 is a side view of a final pressure-bonding unit which is a modified construction example of the final pressure-bonding device of the second embodiment.

Shown in FIGS. 14 and 15 is an example in which a flat plate-like base member 56 is applied. However, instead of the base member 56, a base frame 58 may also be applied, as shown in FIG. 16, the base frame 58 having higher rigidity with its cross section L-shaped and including a linear guide 45 for movably guiding and supporting the lower face of the movable support base 46, and a linear guide 59 for movably guiding and supporting a conveyor device 11-side side face (right-hand side face in the Y-axis direction in the figure) of the movable support base 46. With such a construction adopted, while the final pressure-bonding units 42 are movable, even higher positional accuracy can be ensured by virtue of the rigidity of the base frame 58.

Operation of the final pressure-bonding device 15 in the second embodiment is described with reference to FIG. 17. At a time T1, which is a start of final pressure-bonding operation, the roller 49a and the restricting member 54 are out of contact with each other, in which state an expanding operation of the cylinder device 48 is started from an origin position of the final pressure-bonding head 44 where the cylinder device 48 is contracted. Along with the expanding operation of the cylinder device 48, the final pressure-bonding head 44 is moved toward the receiving member 43 via the swing lever 49, with their distance decreasing gradually. At a time T2, where the distance between the final pressure-bonding head 44 and the receiving member 43 becomes D1, the roller 49a comes into contact with the restricting member 54, so that the moving speed of the roller 49a is restricted by the moving speed of the restricting member 54 from this time onward. By the expansion of the cylinder device 48, movement of the final pressure-bonding head 44 toward the receiving member 43 is performed synchronously under restriction by movement of the restricting member 54 through the swinging operation of the swing link 49 with the roller 49a provided thereon. The moving speed of the restricting member 54 is controlled by the movement control device 55 so as to be decelerated before the distance between the final pressure-bonding head and the receiving member 43 becomes the specified distance D2 where the final pressure-bonding head 44 comes into contact with the component 5, by which the final pressure-bonding head 44 is securely prevented from making an impactive contact with the component 5. At a time T3, the distance between the final pressure-bonding head 44 and the receiving member 43 becomes D2, where the final pressure-bonding head 44 makes contact with the component 5, with the movement of the roller 49a being nearly stopped. Also, by keeping the movement of the restricting member 54 by the movement control device 55 to such a slightly separate specified position as to generate a clearance so that the restricting member 54 is separate from the roller 49a. As a result, an output load of the cylinder device 48 is securely transferred to the final pressure-bonding head 44 through the swing lever 49, so that the component 5 is pressed with a specified pressing force F by the final pressure-bonding head 44. By this pressing state being kept until a time T4 is reached, the component 5 is pressed and pressured at specified temperature and pressure via the ACF 4 by the final pressure-bonding head 44 so that the component 5 is finally pressure-bonded to the mounting area 3 of the lower-side edge portion 2a, 2b of the substrate 1, by which the component 5 is finally pressure-bonded to the mounting area 3 of the substrate 1. At the time T4, the cylinder device 48 is operated for return contraction so that the pressing force is released. At a time T5, the final pressure-bonding head 44 turns back to the origin position. Thereafter, the restricting member 54 is also moved and returned to the origin position by the movement control device 55.

In this second embodiment, as described above, in moving the final pressure-bonding head 44 toward the receiving member 43 by the cylinder device 48, the inclusion of the speed control device 53 that is separable from and contactable with the final pressure-bonding units 42 and that controls the moving speed of the final pressure-bonding head 44 makes it possible to finally pressure-bond the component 5 to the mounting area 3 of the substrate 1 via the ACF 4 at a desired pressing force in a short process time without causing any impactive load while a simple, compact cylinder device is applied. Accordingly, there can be provided a compact apparatus construction in which the final pressure-bonding units 42 can be moved and placed in parallel so as to be operable individually in parallel in accordance with placement intervals of the mounting areas 3 of the substrate 1.

Third Embodiment

Next, a component mounting apparatus according to a third embodiment of the invention is described with reference to FIGS. 18A and 18B.

Figure 18A:
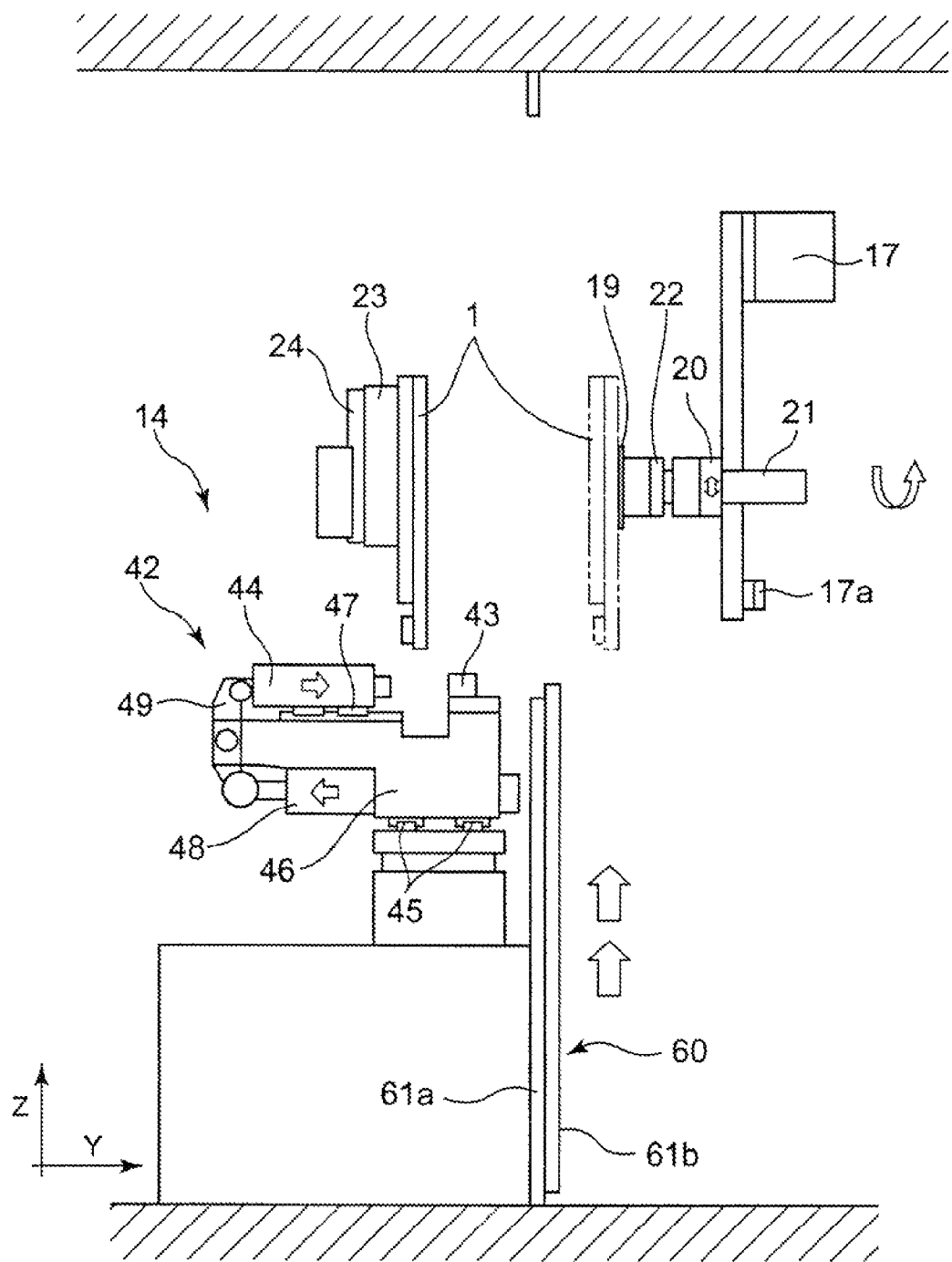
FIG. 18A is a view showing a final pressure-bonding device included in a component mounting apparatus according to a third embodiment of the invention, the view being a side view showing a normal operation state.
Figure 18B:
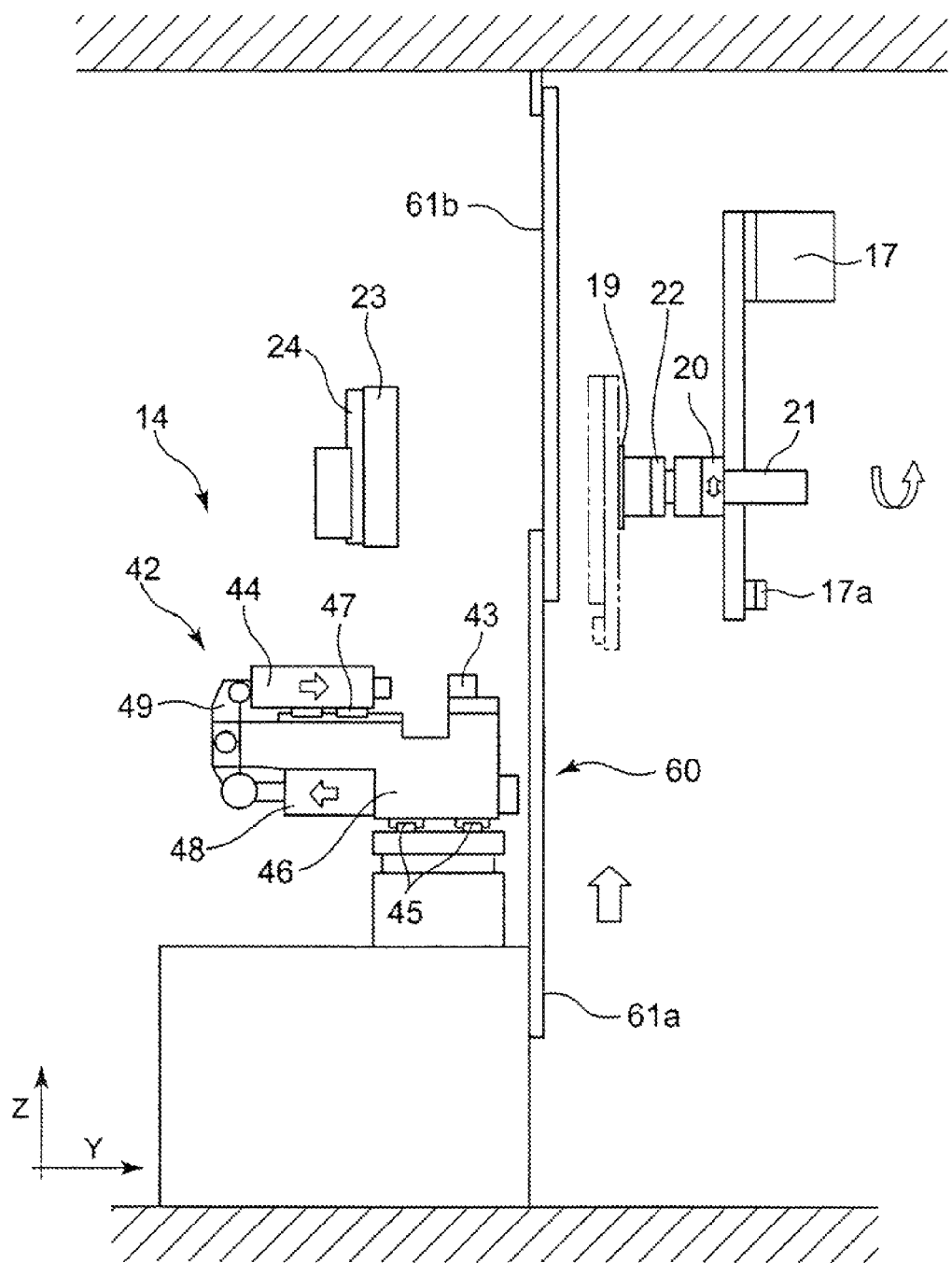
FIG. 18B is a view showing a final pressure-bonding device included in the component mounting apparatus according to the third embodiment of the invention, the view being a side view showing a state in which a breaker device is operated.

The component mounting apparatus 10 of the third embodiment, as shown in FIGS. 18A and 18B, includes an interruption device 60 for interrupting the conveyor device 11 and the working devices 12 to 15 (as an example, final pressure-bonding device 14 is shown in FIGS. 18A and 18B) from each other. In the interruption device 60, as shown in FIG. 18A, shutter members 61a, 61b which are vertically two-divided and independently up-and-down movable are placed one on another in a side-end lower portion of the working devices 12 to 15 on the conveyor device 11 side. In need for maintenance of the working devices 12 to 15, the shutter members 61a, 61b can be moved up to interruption positions as shown in FIG. 18B, so that the conveyor device 11 and the working devices 12 to 15 can be interrupted from each other.

In component mounting apparatuses in which the substrate is conveyed in a horizontal posture for fulfillment of component mounting as in the prior art, the conveyance height position at which the substrate is conveyed, or the height position of the substrate in the individual working devices, is set to meet a minimum height difference necessary to delivery the substrate between the conveyor device and each working device or to move and position the substrate and place the edge portion including the mounting area onto the receiving member. Therefore, the conveyor device is so constructed that substrates are conveyed successively in synchronization with the individual working devices provided successively in the conveyance direction with a view to preventing interference between the conveyed substrate and the movable part of each working device. As a result of adopting this construction, there is a need for stopping the operation of the whole apparatus when any one of the working devices requires maintenance. Accordingly, such a construction of prior-art component mounting apparatuses is a factor of productivity degradation, and moreover when some of the working devices differ in work process time from the others, it is impossible, disadvantageously, to adopt a placement construction in which a plurality of working devices having longer process time are placed and the substrate is fed selectively to one of the working devices and subjected to mounting work so as to improve the productivity. In contrast to this, according to this third embodiment, a particular working device out of the working devices 12 to 15 and the conveyor device 11 can be interrupted from each other by the interruption device 60 during the maintenance of the working devices 12 to 15 or the like. Thus, the maintenance work can be carried out with safety while the conveyor device 11 is kept in operation, making it unnecessary to stop the operation of the whole component mounting apparatus 10 for safety's sake during the maintenance, so that high productivity can be ensured.

In addition, the interruption device is not limited to such members as a shutter that works for physical interruption like the shutter members 61a, 61b shown in FIGS. 18A and 18B. It is also allowable, for example, that an object such as part of the human body or tool or material or the like, when going beyond a border set between the conveyor device 11 and the working devices 12 to 15, is detected by infrared detection means or the like, followed by issuing an alarm or stopping the operation.

Fourth Embodiment

Next, a component mounting apparatus according to a fourth embodiment of the invention is described with reference to FIGS. 19A and 19B.

The foregoing embodiments have been described on examples of construction in which as the plurality of working devices, a single ACF applying device 12, a single component temporary pressure-bonding device 13, and a pair of final pressure-bonding devices 14, 15 are included, where the substrate 1 is passed sequentially through these working devices by the conveyor device 11. In the component mounting apparatus 10 of this fourth embodiment, a singularity or any plurality of working devices 12 to 14 are included, where the substrate 1 can be conveyed to any one of the working devices 12 to 14 by the conveyor device 11 so that the substrate 1 is passed sequentially through the ACF applying device 12, the component temporary pressure-bonding device 13 and the final pressure-bonding device 14 by the conveyor device 11, by which components 5 are efficiently mounted on the substrate 1. In the examples shown in FIGS. 19A and 19B, one ACF applying device 12, two component temporary pressure-bonding devices 13, and three final pressure-bonding devices 14 are placed along the conveyance direction of the substrate 1 by the conveyor device 11.

In the example shown in FIG. 19A, after the ACFs 4 are applied to the mounting areas 3 by the ACF applying device 12, substrates 1 are conveyed alternately to either one of the two component temporary pressure-bonding devices 13, where components 5 are temporarily pressure-bonded to the mounting areas 3, respectively. Thus, substrates 1 that have been completed for temporary pressure-bonding of the components 5 are conveyed one by one to the two of the three final pressure-bonding devices 14, where the components 5 are finally pressure-bonded to both edge portions 2a, 2b, respectively. That is, a substrate 1 is conveyed to any one of the final pressure-bonding devices 14, whichever it is idling, so that the final pressure-bonding device 14 is used to fulfill the finally pressure-bonding of the components 5 in the edge portions 2a, 2b of the substrate 1. Also, in the example shown in FIG. 19B, after the ACFs 4 are applied to the mounting areas 3, respectively, by the ACF applying device 12, substrates 1 are conveyed one by one to the two component temporary pressure-bonding device 13, where the components 5 are temporarily pressure-bonded to the mounting areas 3 of the edge portions 2a, 2b of the substrate 1, and the substrate 1 that has been completed for the temporary pressure-bonding of the components 5, are conveyed one by one to the two of the three final pressure-bonding devices 14, and the components 5 of the edge portions 2a, 2b are finally pressure-bonded. In addition, the third final pressure-bonding device 14 is set to stand by as an auxiliary final pressure-bonding device 14 to be used during maintenance or for line process time balance in the pressure bonding work of necessary products due to longer pressure-bonding time.

In this fourth embodiment, for conveyance of the substrate 1 to the working devices 12 to 14 by the conveyor device 11, the substrate 1 is subjected to specified working processes in succession, and the working devices 12 to 14 are selected so that the process operation time becomes uniform for process balance of the working processes by the working devices 12 to 14, where the substrate 1 is conveyed to the selected working devices 12 to 14 by the conveyor device 11, thus making it securely implementable to uniformize the process operation time of the working processes. Accordingly, high productivity can be ensured, and moreover even when the number of mounting areas 3 is changed in accordance with the size of the substrate 1, operating only a necessary number of working devices 12 to 14 allows a efficient component mounting to be achieved with high productivity.

In the above-described individual embodiments, the bonding member applying device has been shown by an example in which an ACF applying device 12 for applying ACFs 4, which are anisotropically conductive films, is applied. However, apparatuses in other modes are also adoptable. For example, when bump electrodes of components are connected directly to electrodes of the substrate by pressure bonding process, an adhesive material applying device for applying insulative adhesive material may be applied for cases in which an insulative adhesive material (an example of bonding member) is applied as a bonding reinforcement for the components 5 to the mounting areas 3 of the substrate 1. Further, although an example in which the back-and-forth moving device 21 for delivery of the substrate 1 between the conveyor device 11 and the working devices 12 to 15 is included in the substrate conveyance unit 18 of the conveyor device 11 has been described above, yet a back-and-forth moving device for back-and-forth moving the substrate holder 23 may be provided on the working devices 12 to 15 side.

Figure 20:
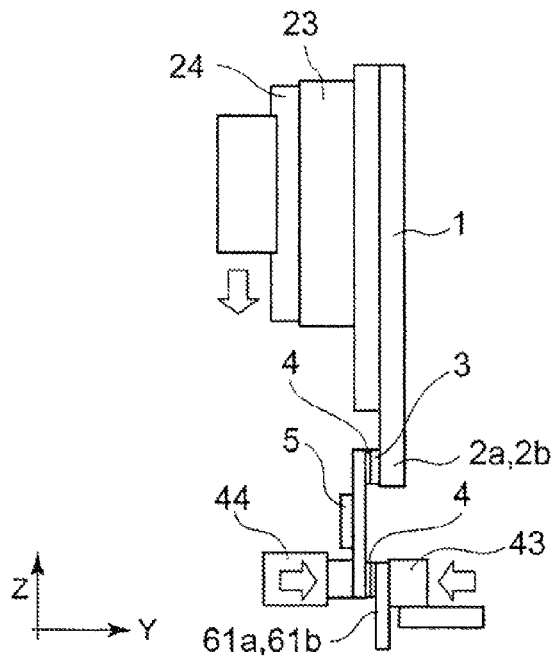
FIG. 20 is a side view of an example in which the component mounting apparatus of the invention is applied to a process of further mounting a printed circuit board on the substrate with interposition of the components mounted in edge portions of the substrate.
Figure 21A:
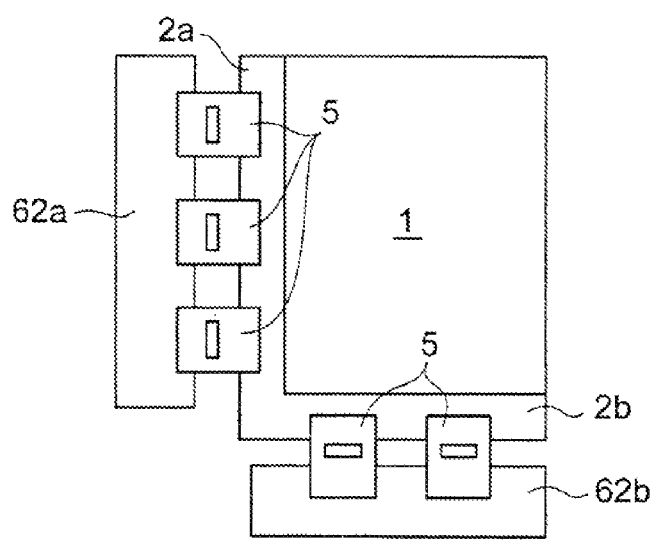
FIG. 21A is a view showing a prior art example in which a printed circuit board is mounted with interposition of the components mounted in edge portions of the substrate, the view being a plan view of a printed-circuit-board mounted state.
Figure 21B:
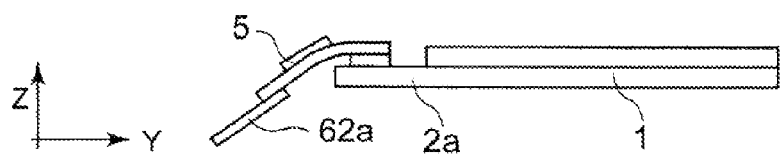
FIG. 21B is a view showing a prior art example in which a printed circuit board is mounted with interposition of the components mounted in edge portions of the substrate, the view being a front view of a printed-circuit-board mounted state.

Moreover, although the above embodiments have been described on an example in which the components 5 are mounted onto the individual mounting areas 3 of the edge portions 2a, 2b of the substrate 1, the component mounting apparatus of the invention may also be applied to cases in which a printed circuit board is further mounted on the individual edge portions 2a, 2b via the mounted components 5. More specifically, when printed circuit boards 62a, 62b are mounted to the edge portions 2a, 2b via the components mounted on the longer-edge side and shorter-edge side edge portions 2a, 2b of the substrate 1 as shown in FIG. 21A, performing conveyance and mounting operations with the substrate in the horizontal posture as in the prior art would cause the substrate 1 or the mounted components 5 to be sagged by their deadweight as shown in FIG. 21B. In contrast to this, with the invention applied, performing the conveyance and mounting operations with the substrate 1 in a substantially vertical posture as shown in FIG. 20 makes it possible to keep the flat surface state of the substrate 1 so that the mounting of the printed circuit boards 62a, 62b onto the components 5 with high productivity with a simple apparatus construction.

Also, the foregoing embodiments have been described on an example in which the substrate conveyance unit 18 of the conveyor device 11 is provided with a mechanism (device) for performing back-and-forth movement in the Y-axis direction and rotational movement of the sucked and held substrate 1. Instead of such a case or in addition to such a case, a mechanism for performing back-and-forth movement in the Y-axis direction and rotational movement of the substrate holder may be included in the individual working devices 12 to 15. Also, in the working devices 12 to 15, moving operations for positioning in the working position for the substrate 1 sucked and held by the substrate holder and the working units have only to be done relative to each other. For example, the working unit side may be moved (e.g., moved up and down) relative to the substrate holder to fulfill the positioning of the two members.

Also, for the purpose of enhancing the safety in suction and holding of the substrate by the conveyance substrate holder of the substrate conveyor unit as well as the suction and holding of the substrate by the substrate holder, for example, a mechanism for preventing the substrate from falling may be provided in the conveyance substrate holder and the substrate holder.

In the present invention, the substantially vertical posture of the substrate do not need to be correctly 90 degrees with respect to the horizontal plane, and has only to be substantially vertical within a range that allows the functional effects of the invention to be obtained, where the substrate may be inclined, for example, by about ±10 degrees as required.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosure of Japanese Patent Applications No. 2008-094796 filed on Apr. 1, 2008, and No. 2008-094807 filed on Apr. 1, 2008, including specification, claims, and drawings are incorporated herein by reference in their entirety.

The invention claimed is:

1. A component mounting apparatus comprising:
 a conveyor device for sucking and holding a flat plate-shaped substrate in a substantially vertical posture and conveying the sucked and held substrate in a direction extending along its flat plate surface and moreover performing delivery of the substrate at a plurality of substrate delivery positions set along the substrate conveyance direction; and
 a plurality of working devices which are placed in correspondence to the plurality of substrate delivery positions of the conveyor device and which perform, in working positions, a working process for mounting components to a mounting area on which the components provided in edge portions of the substantially vertical-postured substrate received from the conveyor device are to be mounted, wherein
 each of the working devices comprises:
 a substrate holder for, at the substrate delivery position of the conveyor device, sucking and holding the flat plate surface of the substrate except at least the mounting area of the lower-side edge portion of the substantially vertical-postured substrate;
 a holder moving device for moving the substrate holder so that the substantially vertical-postured substrate is positioned at the substrate delivery position of the conveyor device and the working position;
 a receiving member which is enabled to move the mounting area of the lower-side edge portion of the substrate, positioned in the working position, between a support position where the substrate is supported from its back face side that is opposite to the mounting area side and a withdrawal position withdrawn from the support position; and
 a working unit for performing the working process on the mounting area of the edge portion of the substrate positioned in the working position from its front face side that is the mounting area side.

2. The component mounting apparatus according to claim 1, wherein, in each working device,
 the holder moving device is a holder up/down device for moving up and down the substrate holder between the substrate delivery position of the conveyor device and the working position located lower than the substrate delivery position, and
 the working unit performs, in the working position, the working process for the mounting area provided in the lower-side edge portion of the substantially vertical-postured substrate.

3. The component mounting apparatus according to claim 2, wherein
 the conveyor device includes a plurality of substrate conveyor units which are, individually and independently, reciprocatively moved between the substrate delivery positions along a single conveyance path continued in a direction extending along the flat plate surface of the substrate, and
 each of the substrate conveyor units includes a conveyance substrate holder for sucking and holding the back face side of the substantially vertical-postured substrate.

4. The component mounting apparatus according to claim 3, wherein
 each of the substrate delivery positions in the conveyor device is located horizontally separate from the single conveyance path continued in the direction extending along the flat plate surface of the substrate, and
 each of the substrate conveyor units includes a horizontal-direction moving device for moving back and forth the conveyance substrate holder in a horizontal direction between the conveyance path and the substrate delivery position.

5. The component mounting apparatus according to claim 4, wherein
 each of the substrate conveyor units includes a rotating device for rotationally moving the conveyance substrate holder about a rotation axis orthogonal to the flat plate surface of the substrate.

6. The component mounting apparatus according to claim 2, wherein
 each of the plurality of working devices includes:
 a bonding member applying device for applying a bonding member to a mounting area of the substrate;
 a component temporary pressure-bonding device for temporarily pressure-bonding components via the bonding member applied to the mounting area of the substrate; and
 a final component pressure-bonding device for simultaneously heating and pressuring temporarily pressure-bonded components to the mounting area of the substrate to mount the components thereon.

7. The component mounting apparatus according to claim 6, wherein, for each of the working devices,
 the component temporary pressure-bonding device includes:
 a recognition device for, at a position in the mounting area of the substrate positioned in the working position in the substantially vertical posture or at a position substantially corresponding to the mounting area, recognizing positions of the mounting area of the substrate and the components; and
 a control device for controlling operations of the holder up/down device, the receiving member, the working unit, and the recognition device, and wherein
 the control device is operable to control operations of the holder up/down device, the receiving member, the working unit and the recognition device through the controlling of: by the holder up/down device, moving down the substrate from the substrate delivery position to position a lower-side edge portion of the substrate to the working position; by the recognition device, recognizing a position of a mounting area of the substrate from the back face side of the substrate; thereafter, by the up/down device, once moving up for withdrawal the substrate upward of the working position; then, by the working unit, positioning a component to be temporarily pressure-bonded to a component temporary pressure-bonding position; by the recognition device, recognizing the position of the component, and thereafter moving for withdrawal the component from the temporary pressure-bonding position; thereafter, by the up/down device, moving down the substrate to again perform positioning to the working position and moreover moving the receiving member to a position where the mounting area of the substrate is supported from the back face side of the substrate; thereafter, by the working unit, correcting the position of the component so that recognized positions of the mounting area of the substrate and the component become coincident with each other, in which state the component is temporarily pressure-bonded to the mounting area of the substrate.

8. The component mounting apparatus according to claim 6, wherein, for each of the working devices, the component temporary pressure-bonding device includes:

a recognition device for, at a position in the mounting area of the substrate positioned in the working position in the substantially vertical posture or at a position substantially corresponding to the mounting area, recognizing positions of the mounting area of the substrate and the components; and a control device for controlling operations of the holder up/down device, the receiving member, the working unit, and the recognition device, and wherein the control device is operable to control operations of the holder up/down device, the receiving member, the working unit and the recognition device through the controlling of: by the working unit, positioning a component to be temporarily pressure-bonded to a component temporary pressure-bonding position; by the recognition device, recognizing the position of the component, and thereafter moving for withdrawal the component from the temporary pressure-bonding position; thereafter, by the holder up/down device, moving down the substrate from the substrate delivery position to position a lower-side edge portion of the substrate to the working position and moreover moving the receiving member to a position where the mounting area of the substrate is supported from the back face side; thereafter, by the recognition device, recognizing the position of the mounting area of the substrate from the back face side of the substrate; thereafter, by the working unit, correcting the position of the component so that recognized positions of the mounting area of the substrate and the component become coincident with each other, in which state the component is temporarily pressure-bonded to the mounting area of the substrate.

9. The component mounting apparatus according to claim 1, further comprising, between the conveyor device and the working devices, an interruption device for inhibiting movement of any object between the two devices.

10. A component mounting method comprising:

a conveyance process for sucking and holding a flat plate-shaped substrate in a substantially vertical posture by a conveyor device, conveying the sucked and held substrate in a direction extending along the flat plate surface and making delivery of the substrate to a plurality of substrate delivery positions set along a substrate conveyance direction;

working processes for, by working units placed in correspondence to the plurality of substrate delivery positions, respectively, performing processes for component mounting, at working positions, for a mounting area on which components provided in a lower-side edge portion of the substantially vertical-postured substrate are to be mounted;

each of the working processes includes:

a first working process for, at a substrate delivery position of the conveyor device, sucking and holding the flat plate surface of the substrate except at least the mounting area of the lower-side edge portion of the substantially vertical-postured substrate, and positioning the substrate, as it is in the substantially vertical posture, to a working position located lower than the substrate delivery position; and a second working process for moving a receiving member toward a back face of the substrate positioned at the working position, which is a surface opposite to the mounting area side surface of the substrate, and performing the process for component mounting from a front face side of the substrate for the mounting area of the substrate in a state that the mounting area of the substrate is supported by the receiving member from the back face side of the substrate.

* * * * *